United States Patent
Park et al.

(10) Patent No.: US 6,992,506 B2
(45) Date of Patent: Jan. 31, 2006

(54) INTEGRATED CIRCUIT DEVICES HAVING DATA INVERSION CIRCUITS THEREIN WITH MULTI-BIT PREFETCH STRUCTURES AND METHODS OF OPERATING SAME

(75) Inventors: Min-sang Park, Gyeonggi-do (KR); Jin-seok Kwak, Gyeonggi-do (KR); Seong-jin Jang, Gyeonggi-do (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 10/815,505

(22) Filed: Apr. 1, 2004

(65) Prior Publication Data

US 2004/0205447 A1 Oct. 14, 2004

Related U.S. Application Data

(63) Continuation-in-part of application No. 10/397,773, filed on Mar. 26, 2003, now Pat. No. 6,788,106.

(30) Foreign Application Priority Data

Dec. 13, 2003 (KR) ...................... 10-2003-0090939

(51) Int. Cl.
*G06F 7/50* (2006.01)
*G06F 11/00* (2006.01)
*H03K 19/21* (2006.01)
*H03M 13/00* (2006.01)

(52) U.S. Cl. ........................................ 326/52; 714/800
(58) Field of Classification Search ................ 365/219, 365/233; 710/11, 65; 714/765, 800, 758, 714/801; 326/52
See application file for complete search history.

(56) References Cited

U.S. PATENT DOCUMENTS

| | | | |
|---|---|---|---|
| 4,462,102 A | 7/1984 | Povlick | |
| 5,477,551 A | 12/1995 | Parks | |
| 5,881,076 A * | 3/1999 | Murray | ....................... 714/800 |
| 5,915,082 A * | 6/1999 | Marshall et al. | .............. 714/11 |
| 5,931,927 A | 8/1999 | Takashima | |
| 6,456,551 B2 | 9/2002 | Sohn | |
| 6,731,567 B2 | 5/2004 | Acharya | |
| 6,735,733 B2 * | 5/2004 | La Rosa | ..................... 714/765 |

* cited by examiner

*Primary Examiner*—Patrick Wamsley
(74) *Attorney, Agent, or Firm*—Myers Bigel Sibley & Sajovec

(57) ABSTRACT

Integrated circuit devices include data inversion circuits therein that are configured to evaluate at least first and second ordered groups of input data in parallel with an ordered group of output data previously generated by the data inversion circuit. The data inversion circuit is further configured to generate inverted versions of the first and second ordered groups of input data as versions of the first and second ordered groups of data in parallel at outputs thereof whenever a number of bit differences between the first ordered group of input data and the ordered group of output data is greater than one-half a size of the first ordered group of input data and a number of bit differences between the second ordered group of input data and the version of the first ordered group of input data is greater than one-half a size of the second ordered group of input data, respectively.

8 Claims, 13 Drawing Sheets

INTEGRATED CIRCUIT DEVICES HAVING DATA INVERSION CIRCUITS THEREIN WITH MULTI-BIT PREFETCH STRUCTURES AND METHODS OF OPERATING SAME

REFERENCE TO PRIORITY APPLICATION

This application is a continuation-in-part (CIP) of U.S. application Ser. No. 10/397,773, filed Mar. 26, 2003, now U.S. Pat. No. 6,788,106, the disclosure of which is hereby incorporated herein by reference. This application also claims priority to Korean Application Serial No. 2003-90939, filed Dec. 13, 2003, the disclosure of which is hereby incorporated herein by reference.

FIELD OF THE INVENTION

The present invention relates to integrated circuit devices and, more particularly, to integrated circuit devices having high data bandwidth.

BACKGROUND OF THE INVENTION

Integrated circuit devices that support high data bandwidth may suffer from simultaneous switching noise (SSN), particularly when switching a plurality of output pins or driving groups of parallel signal lines (e.g., buses) at high frequency. Conventional techniques to reduce SSN have included the use of data inversion circuits that operate to limit the number of parallel data signals that switch value during consecutive data output cycles. For example, FIG. 1 illustrates a conventional data inversion circuit 10 that includes an input XOR circuit 11, a data comparator 13 and an output XOR circuit 12. The input XOR circuit 11 receives a plurality of current input signals FDO1–FDO8 and a plurality of prior output signals DO1–DO8, which are fed back from parallel output pins of the data inversion circuit 10. The XOR logic gates within the input XOR circuit 11 generate a plurality of signals that are provided to inputs of the data comparator 13. This data comparator 13 is configured to generate a single flag signal (FLG) having a logic value equal to 1 whenever a number of bit differences ($\Delta$) between the data pairs (FDO1, DO1), (FDO2, DO2), (FD31, DO3), (FDO4, DO4), (FDO5, DO5), (FDO6, DO6), (FDO7, DO7) and (FDO8, DO8) is greater than or equal to four (4). This flag signal may also be referred to as a parity signal (S). Thus, if the prior value of DO1–DO8=[00000000] and the new value of FDO1–FDO8=[11111110], then the flag signal FLG will have a value of 1 because $\Delta=7$. In this case, the operation will be performed by the output XOR circuit 12 and the new output signals DO1–DO8 will be generated as [00000001].

As will be understood by those skilled in the art, the receipt of this flag signal FLG at the inputs of the NOR gates within the output XOR circuit 12 may be delayed relative to the leading edges of the current input signals FDO1–FDO8, which are evaluated when determining the value of the flag signal FLG. In particular, a sum of the timing delays generated by the input XOR circuit 11 and the data comparator 13 may equal the delay between the leading edges of the current input signals FDO1–FDO8 and the leading edge of the flag signal FLG received by the output XOR circuit 12. This delay may operate to reduce the width of the data valid window that is present at the outputs of the output XOR circuit 12 and thereby reduce a maximum operating frequency of the data inversion circuit 10.

Another conventional technique for reducing SSN in integrated circuits that output parallel signals to a data bus is disclosed in U.S. Pat. No. 5,931,927 to Takashima. In particular, FIG. 3 of the '927 patent illustrates an input/output device that generates an m-bit data signal and a single bit parity signal to a bus. Half of the m-bit data signal may be inverted if necessary to make the number of "1" signal values more nearly equivalent to the number of "0" signal values that are generated during an output cycle. In particular, the '927 patent shows a Circuit A (left side) and a Circuit A (right side), with each circuit receiving ½ m bits of data. If the Circuit A (left side) and the Circuit A (right side) all receive logic 1 signals, then the parity outputs from the two circuits will be equal to "1", which reflects the fact that more "1s" than "0s" are present. When this occurs, a data inversion flag, which is generated by an exclusive XNOR gate, will be set to a logic 1 value. When the data inversion flag is set to a logic 1 value, then the outputs of the Circuit A (right side) will be inverted by the data inversion circuit. Accordingly, the output buffer (left side) will receive all "1s" from the Circuit A (left side) and the output buffer (right side) will receive all "0s" from the data inversion circuit. A single-bit output buffer will also generate a flag signal (F1) so that the inversion of the data from the Circuit A (right side) can be properly interpreted once the data is passed to the bus.

Thus, in FIG. 3 of the '927 patent, if the m-bit data signal provided to circuit A (left side) and circuit A (right side) during a first cycle is: 11111000 and 00000111 and the m-bit data signal provided during a second cycle is: 00000111 and 11111000, then the data inversion flag will not be set and the m-bit data provided to the bus during consecutive cycles will be:

| 1st cycle: | 1 | 1 | 1 | 1 | 1 | 0 | 0 | 0 | 0 | 0 | 0 | 0 | 0 | 1 | 1 | 1 | |
|---|---|---|---|---|---|---|---|---|---|---|---|---|---|---|---|---|---|
| | ↓ | ↓ | ↓ | ↓ | ↓ | ↓ | ↓ | ↓ | ↓ | ↓ | ↓ | ↓ | ↓ | ↓ | ↓ | ↓ | |
| 2nd cycle: | 0 | 0 | 0 | 0 | 0 | 1 | 1 | 1 | 1 | 1 | 1 | 1 | 1 | 0 | 0 | 0 | $\Delta=16$ | new output signals DO1–DO8 will equal [00000001], which means that only one of the output pins will switch value between the old and new output signals. The flag signal FLG will also be provided as an output of the data inversion circuit 10 so that the circuit or device receiving the output signals can properly interpret their values. In contrast, if the prior value of DO1–DO8=[00001111] and the new value of FDO1–FDO8=[00000001], then the flag signal FLG will have a value of 0 because $\Delta=3$. In this case, no data inversion Thus, using the circuit of FIG. 3 of the '927 patent, the number of "1s" and "0s" generated during the first cycle are equivalent (at eight each) and the number of "1s" and "0s" generated during the second cycle are also equivalent (at eight each). However, the number of bit differences ($\Delta$) from the first cycle to the second cycle will equal a maximum of sixteen (i.e., $\Delta=16$), which means that all output signal lines to the bus will be switched high-to-low or low-to-high when passing from the first cycle to the second cycle. This high level of switching can lead to unacceptable simultaneous switching noise, even if the total number of "1s" and the total number of "0s" during the first and second cycles is maintained at about an equivalent level.

Accordingly, notwithstanding these conventional techniques for reducing simultaneous switching noise, there continues to be a need for data inversion circuits that can handle high data bandwidths with high degrees of immunity from SSN. There also continues to be a need for data inversion circuits that can operate at high frequency.

SUMMARY OF THE INVENTION

Integrated circuit devices according to embodiments of the present invention reduce simultaneous switching noise (SSN) when performing high data bandwidth switching operations. These devices also enable the interleaving of data onto data pins in a serial format from data that was originally generated and processed in a parallel format. The parallel format data may be generated within a memory device, such as a dual data rate (DDR) memory device with 4-bit prefetch, or other device that is configured to drive a plurality of signal lines with parallel streams of data, including bus driver circuitry.

In some embodiments of the present invention, a data inversion circuit is provided that processes new data in parallel and also evaluates the new data relative to previously generated output data, which is fed back as an input to the data inversion circuit. In particular, the data inversion circuit is configured to evaluate bit differences between the first and second ordered groups of data received in parallel at inputs thereof by performing bit-to-bit comparisons between corresponding bits in the first and second ordered groups of data. The data inversion circuit is further configured to generate a version of the first ordered group of data in parallel with an inverted version of the second ordered group of data at outputs thereof when a number of bit differences between the version of the first ordered group of data and the second ordered group of data is greater than one-half the number of bits of data within the second ordered group of data. The version of the first ordered group of data may be a noninverted version or an inverted version of the data.

Integrated circuit devices according to further embodiments of the present invention include a data inversion circuit that is configured to evaluate at least first and second ordered groups of current input data in parallel with an ordered group of prior output data. In particular, the data inversion circuit includes primarily combinational logic that is configured to output inverted or non-inverted versions of the first and second ordered groups of current input data as first and second ordered groups of current output data, respectively. This primarily combinational logic is configured to maintain a number of bit inversions (Δ) between the ordered group of prior output data and the first ordered group of current output data at less than or equal to one-half a size of the first ordered group of current output data. The logic is also configured to maintain a number of bit inversions between the first ordered group of current output data and the second ordered group of current output data at less than or equal to one-half a size of the second ordered group of current output data. In this manner, the number of signal lines or pins that undergo switching from one cycle to the next cycle can be kept relatively small to thereby inhibit simultaneous switching noise. In still further embodiments of the present invention, the data inversion circuit may include a plurality of delay circuits that are configured to generate delayed versions of the ordered groups of data. These delay circuits are provided to narrow the delay margins between the generation of the delayed versions of the ordered groups of data and external parity signals.

According to still further embodiments of the present invention, there is provided a data inversion circuit of a semiconductor device with a multiple bit pre-fetch structure, the data inversion circuit comprises a plurality of inversion circuits. The plurality of inversion circuits in parallel receive a plurality of input data pre-fetched simultaneously with output data (hereinafter, referred to as initial input data) output during a previous clock cycle, perform inversion/non-inversion for the plurality of input data, and generate a plurality of output data. Each of the plurality of inversion circuits receive two input data neighboring in an output order among the initial input data and the plurality of input data, determines how many corresponding bits of the two input data are toggled, and performs inversion/non-inversion for latter one of the two input data according to the determined result.

It is preferable that at least one of the plurality of inversion circuits comprises a first logic circuit, a comparator, and a second logic circuit. The first logic circuit receives the initial input data and first input data among the plurality of input data, determines how many bits of the initial input data are toggled with corresponding bits of the first input data, and outputs an internal logic signal according to the determined result. The comparator outputs a flag signal in response to the internal logic signal. The second logic circuit inverts and outputs the first input data as first output data of the plurality of output data or outputs the first input data without inversion, in response to the flag signal.

It is preferable that at least one of the plurality of inversion circuits comprises a first logic circuit, a comparator, a flag signal generator, and a second logic circuit. The first logic circuit receives Jth input data (J is an integer greater than one) and Jth-1 input data among the plurality of input data, determines how many bits of the Jth input data are toggled with corresponding bits of the Jth-1 input data, and outputs an internal logic signal according to the determined result. The comparator outputs an internal flag signal in response to the internal logic signal. The flag signal generator circuit inverts and outputs the internal flag signal as a Jth flag signal or outputs the internal flag signal without inversion as a Jth flag signal, in response to the Jth-1 flag signal. The second logic circuit inverts and outputs the Jth input data as Jth output data among the plurality of output data or outputs the Jth input data without inversion as Jth output data, in response to the Jth flag signal.

It is preferable that at least one of the plurality of inversion circuits comprises a first logic circuit, a comparison circuit, a selector, and a second logic circuit. The first logic circuit receives Jth input data (J is an integer greater than one) and Jth-1 input data among the plurality of input data, determines how many bits of the Jth input data are toggled respectively with corresponding bits of the Jth-1 input data, and outputs an internal logic signal according to the determined result. The comparison circuit outputs an internal flag signal and an inverted internal flag signal in response to the internal logic signal. The selector selects any one of the internal flag signal and the inverted internal flag signal in response to a Jth-1 flag signal and outputs the selected signal as a first flag signal. The second logic circuit inverts and outputs the Jth input data as Jth output data among the plurality of output data and outputs the Jth input data without inversion, in response to the Jth flag signal.

It is preferable that at least one of the plurality of inversion circuits further includes a delay circuit which receives the first input data, delays the first input data by a predetermined time, and outputs the delayed first input data to the second logic circuit. The predetermined time is a time taken until the flag signal is output from the comparator after the first input data is input to the first logic circuit.

It is preferable that at least one of the plurality of inversion circuits further comprises a delay circuit which receives the Jth input data, delays the Jth input data by a predetermined time, and outputs the delayed Jth input data to the second logic circuit, wherein the predetermined time is a time taken until the Jth flag signal is output from the flag signal generator after the Jth input data is input to the first logic circuit.

According to another aspect of the present invention, there is provided a data inversion method used in a semiconductor device with a multiple bit pre-fetch structure, the method comprising: (a) in parallel receiving a plurality of input data simultaneously pre-fetched with output data (hereinafter, referred to as initial input data) output during a previous clock cycle; (b) determining how many corresponding bits of two neighboring input data in an output order among the initial input data and the plurality of input data are toggled to each other and generating a plurality of flag signals according to the determined result; and (c) performing inversion/non-inversion for the plurality of input data in response to the plurality of flag signals and generating a plurality of output data.

BRIEF DESCRIPTION OF THE DRAWINGS

The above and other features and advantages of the present invention will become more apparent by describing in detail exemplary embodiments thereof with reference to the attached drawings in which:

FIG. 11$b$ is a timing diagram for input signals of second logic circuits shown in FIG. 10.

DETAILED DESCRIPTION OF THE INVENTION

Figure 1:
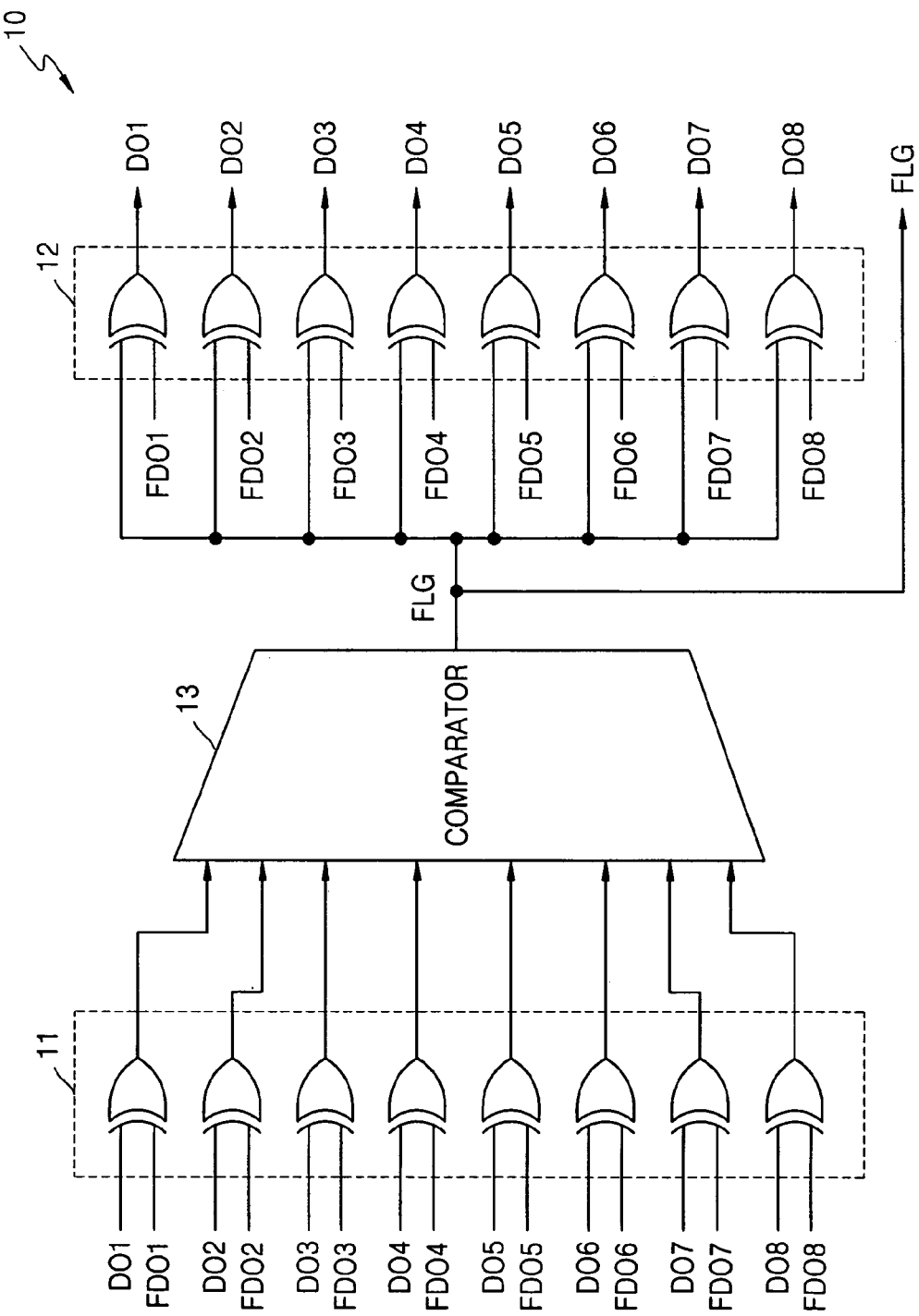
FIG. 1 illustrates a conventional data inversion circuit.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals. Moreover, when a device or element is stated as being responsive to a signal(s), it may be directly responsive to the signal(s) or indirectly responsive to the signal(s) (e.g., responsive to another signal(s) that is derived from the signal(s)).

Figure 2:
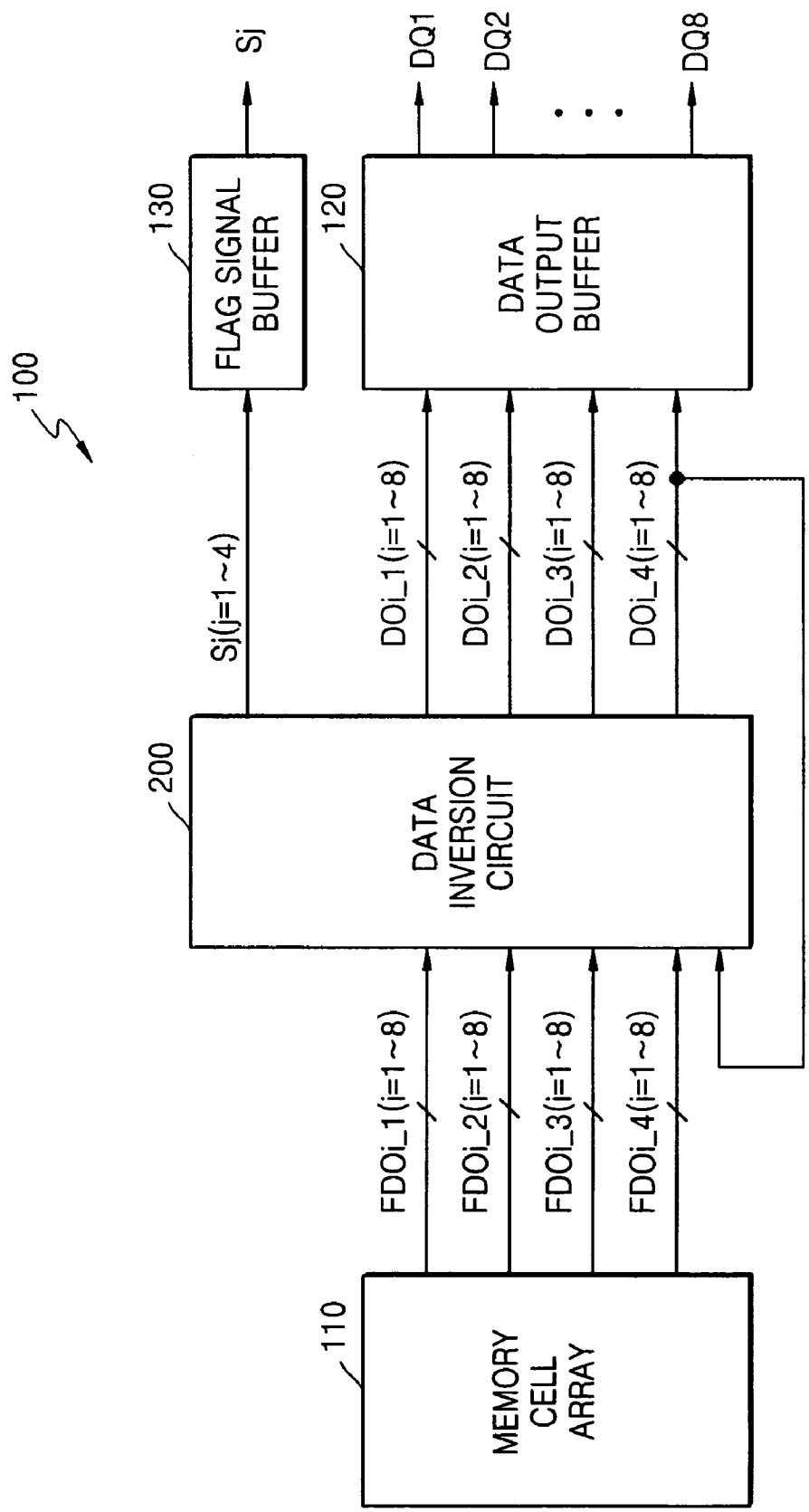
FIG. 2 is a block diagram of a semiconductor memory device including a data inversion circuit according to the present invention.

FIG. 2 is a block diagram of a semiconductor memory device including a data inversion circuit according to the present invention. FIG. 2 shows a semiconductor memory device 100 with a 4-bit pre-fetch structure, which includes 8 DQ pads DQ1 through DQ8. Referring to FIG. 2, the semiconductor memory device 100 includes a memory cell array 110, a data inversion circuit 200, a data output buffer 120, and a flag signal buffer 130. The memory cell array 110 pre-fetches first through fourth input data FDOi_1 through FDOi_4 (i=1 through 8) at the same time in response to a data read command and outputs the first through fourth input data FDOi_1 through FDOi_4 in parallel. Each of the first through fourth input data FDOi_1 through FDOi_4 includes data of 8 bits each corresponding to the 8 DQ pads DQ1 through DQ8. As a result, four groups of eight bits of data/group (i.e., 32 bits) are read from the memory cell array 110 in response to the data read command.

In FIG. 2, FDOi_1 represents data of one bit to be first output from an i-th DQ pad and FDOi_2 represents data of one bit to be secondly output from the i-th DQ pad. Likewise, FDOi_3 represents data of one bit to be thirdly output from the i-th DQ pad and FDOi_4 represents data of one bit to be fourthly output from the i-th DQ pad. Thus, the data output on the 8th DQ pad represents the sequence FDO8_1, FDO8_2, FDO8_3, and FDO8_4.

The data inversion circuit 200 receives the first through fourth input data FDOi_1 through FDOi_4 output from the memory cell array 110 and decides whether to invert each the first through fourth input data FDOi_1 through FDOi_4. Then, the data inversion circuit 200 inverts and outputs each the first through fourth input data FDOi_1 through FDOi_4 or outputs each the first through fourth input data FDOi_1 through FDOi_4 without inversion, as first through fourth output data DOi_1 through DOi_4 (i=1 through 8), according to a decided result. Also, the data inversion circuit 200 outputs a flag signal Sj (i=1 through 4) indicating which data among the first through fourth input data FDOi_1 through FDOi_4 is inverted. This flag signal may also be referred to as a parity signal.

The data output buffer 120 receives the first through fourth output data DOi_1 through DOi_4 output from the data inversion circuit 200 and outputs the first through fourth output data DOi_1 through DOi_4 outside the semiconductor memory device 100 through the first through eighth DQ pads DQ1 through DQ8.

Meanwhile, the flag signal Sj (j=1 through 4) output from the data inversion circuit 200 is output outside the semiconductor memory device 100 through the flag signal buffer 130. The flag signal is preferably output outside the semiconductor memory device 100 through a data masking pin (hereinafter, referred to as a DM pin). The DM pin is a separate pin from data pins and is generally included in SDRAM. The DM pin is used to mask input data in a write mode, that is, it is used for preventing input data from being written in a semiconductor memory device. The DM pin is generally not used in a read mode. Accordingly, since the conventional DM pin is used for outputting the flag signal, the semiconductor memory device does not require an additional pin for outputting the flag signal.

Figure 3:
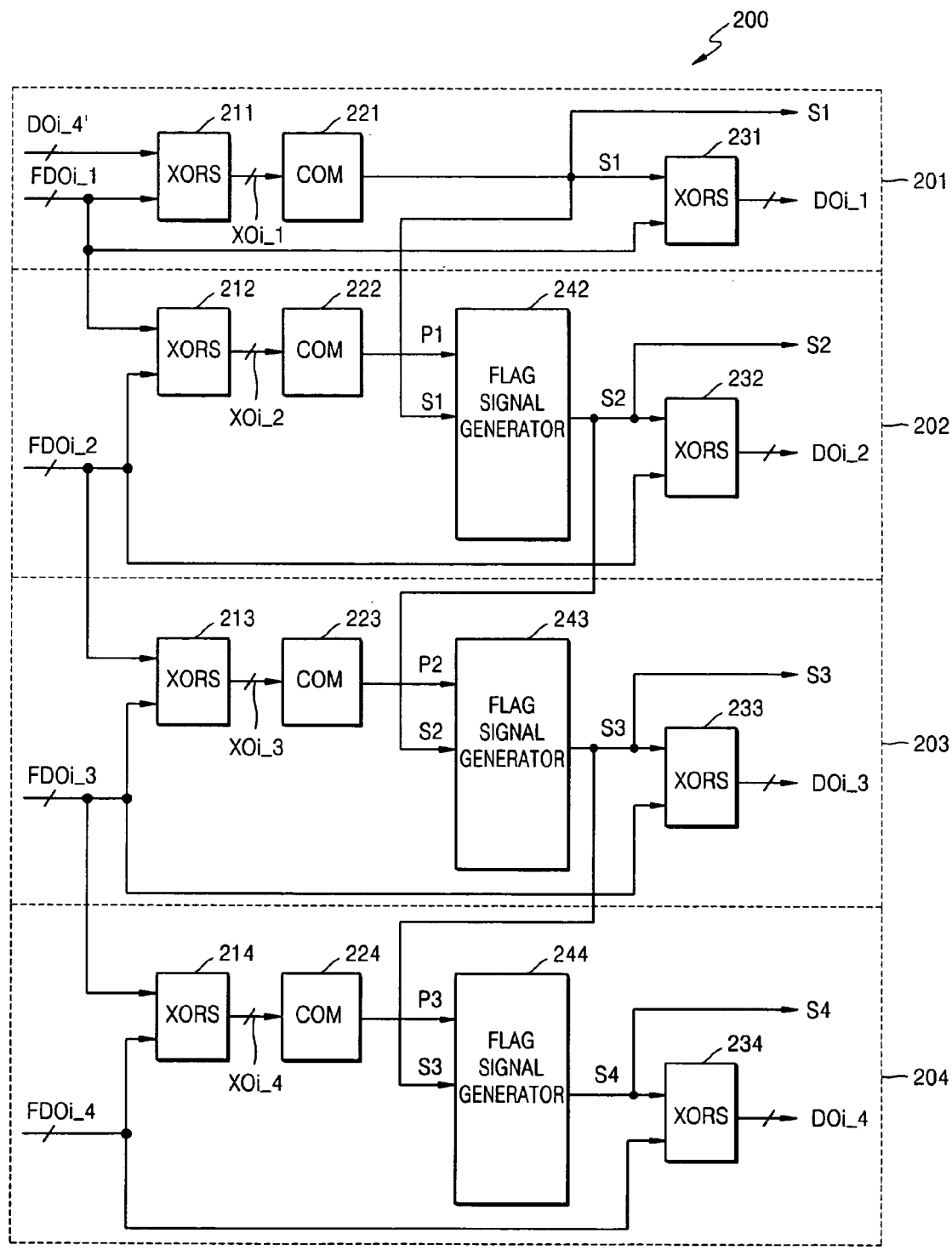
FIG. 3 is a detailed block diagram of the data inversion circuit shown in FIG. 2, according to an embodiment of the present invention.

FIG. 3 is a detailed block diagram of the data inversion circuit shown in FIG. 2, according to an embodiment of the present invention. Referring to FIG. 3, the data inversion circuit 200 includes first through fourth inversion circuits 201 through 204. FIG. 3 shows a data inversion circuit 200 including 4 inversion circuits according to a 4-bit pre-fetch scheme. The number of inversion circuits included in the data inversion circuit 200 can be changed according to a pre-fetch scheme. For example, if a 6-bit pre-fetch scheme is used, the data inversion circuit would include six inversion circuits.

The first through fourth inversion circuits 201 through 204 includes first logic circuits 211 through 214, comparators 221 through 224, and second logic circuits 231 through 234. Also, the second through fourth inversion circuits 202 through 204 further includes flag signal generators 242 through 244. In the first inversion circuit 201, the first logic circuit 211 receives the first input data FDOi_1 of 8 bits and fourth output data DOi_4' of 8 bits output from the fourth inversion circuit 204 during the previous clock cycle and outputs an internal logic signal XOi_1 (i=1 through 8). In more detail, the first logic circuit 211 determines how many bits of the first input data FDOi_1 are toggled with the corresponding bits of the fourth output data DOi_4' and outputs the internal logic signal XOi_1 according to the determined result. The comparator 221 outputs a first flag signal S1 in response to the internal logic signal XOi_1. The second logic circuit 231 inverts and outputs the first input data FDOi_1 or outputs the first input data FDOi_1 without inversion, as first output data DOi_1, in response to the first flag signal S1. Here, the fourth output data FDOi_4' is latched by a latch circuit (not shown). Also, the first input data FDOi_1 is data to be first output through the first through eighth DQ pads among the first through fourth input data FDOi_1, FDOi_2, FDOi_3, and FDOi_4 simultaneously pre-fetched. The first inversion circuit 201 will be described later in more detail with reference to FIG. 4.

In the second inversion circuit 202, the first logic circuit 212 receives the first input data FDOi_1 of 8 bits and the second input data FDOi_2 of 8 bits, and outputs an internal logic signal XOi_2 (i=1 through 8). In more detail, the first logic circuit 212 determines how many bits of the first input data FDOi_1 are toggled with the corresponding bits of the second input data FDOi_2, and outputs the internal logic signal XOi_2 according to the determined result. The comparator 222 outputs a first internal flag signal P1 in response to the internal logic signal XOi_2. The flag signal generator 242 inverts and outputs the first internal flag signal P1 or outputs the first internal flag signal P1 without inversion, as a second flag signal S2, in response to the first flag signal S1. The second logic circuit 232 inverts and outputs the second input data FDOi_2 or outputs the second input data FDOi_2 without inversion, as second output data DOi_2, in response to the second flag signal S2. Here, the second input data FDOi_2 is data to be secondly output through the first through eighth DQ pads, among the first through fourth input data FDOi_1, FDOi_2, FDOi_3, and FDOi_4 simultaneously pre-fetched. The second inversion circuit 202 will be described later in more detail with reference to FIG. 5.

In the third inversion circuit 203, the first logic circuit 213 receives the second input data FDOi_2 of 8 bits and the third input data FDOi_3 of 8 bits, and outputs an internal logic signal XOi_3 (i=1 through 8). In more detail, the first logic circuit 213 determines how many bits of the second input data FDOi_2 are toggled with the corresponding bits of the third input data FDOi_3, and outputs the internal logic signal XOi_3 according to the determined result. The comparator 223 outputs a second internal flag signal P2 in response to the internal logic signal XOi_3. The flag signal generator 243 inverts and outputs the second internal flag signal P2 or outputs the second internal flag signal P2 without inversion, as a third flag signal S3, in response to the second flag signal S2. The second logic circuit 233 inverts and outputs the third input data FDOi_3 or outputs the third input data FDOi_3 without inversion, as third output data DOi_3, in response to the third flag signal S3. Here, the third input data FDOi_3 is data to be thirdly output through the first through eighth DQ pads, among the first through fourth input data FDOi_1, FDOi_2, FDOi_3, and FDOi_4 simultaneously pre-fetched.

In the fourth inversion circuit 204, the first logic circuit 214 receives the third input data FDOi_3 of 8 bits and the fourth input data FDOi_4 of 8 bits, and outputs an internal logic signal XOi_4 (i=1 through 8). In more detail, the first logic circuit 214 determines how many bits of the third input data FDOi_3 are toggled with the corresponding bits of the fourth input data FDOi_4, and outputs the internal logic signal XOi_4 according to the determined result. The comparator 224 outputs a third internal flag signal P3 in response to the internal logic signal XOi_4. The flag signal generator 244 inverts and outputs the third internal flag signal P3 or outputs the third internal flag signal P3 without inversion, as fourth flag signal P4, in response to the third flag signal S3. The second logic circuit 234 inverts and outputs the fourth input data FDOi_4 or outputs the fourth input data FDOi_4 without inversion, as fourth output data DOi_4, in response to the fourth flag signal S4. Here, the fourth input data FDOi_4 is data to be fourthly output through the first through eighth DQ pads, among the first through fourth input data FDOi_1, FDOi_2, FDOi_3, and FDOi_4 simultaneously pre-fetched. Here, the comparators 221 through 224 will be described later in more detail with reference to FIG. 6.

Figure 4:
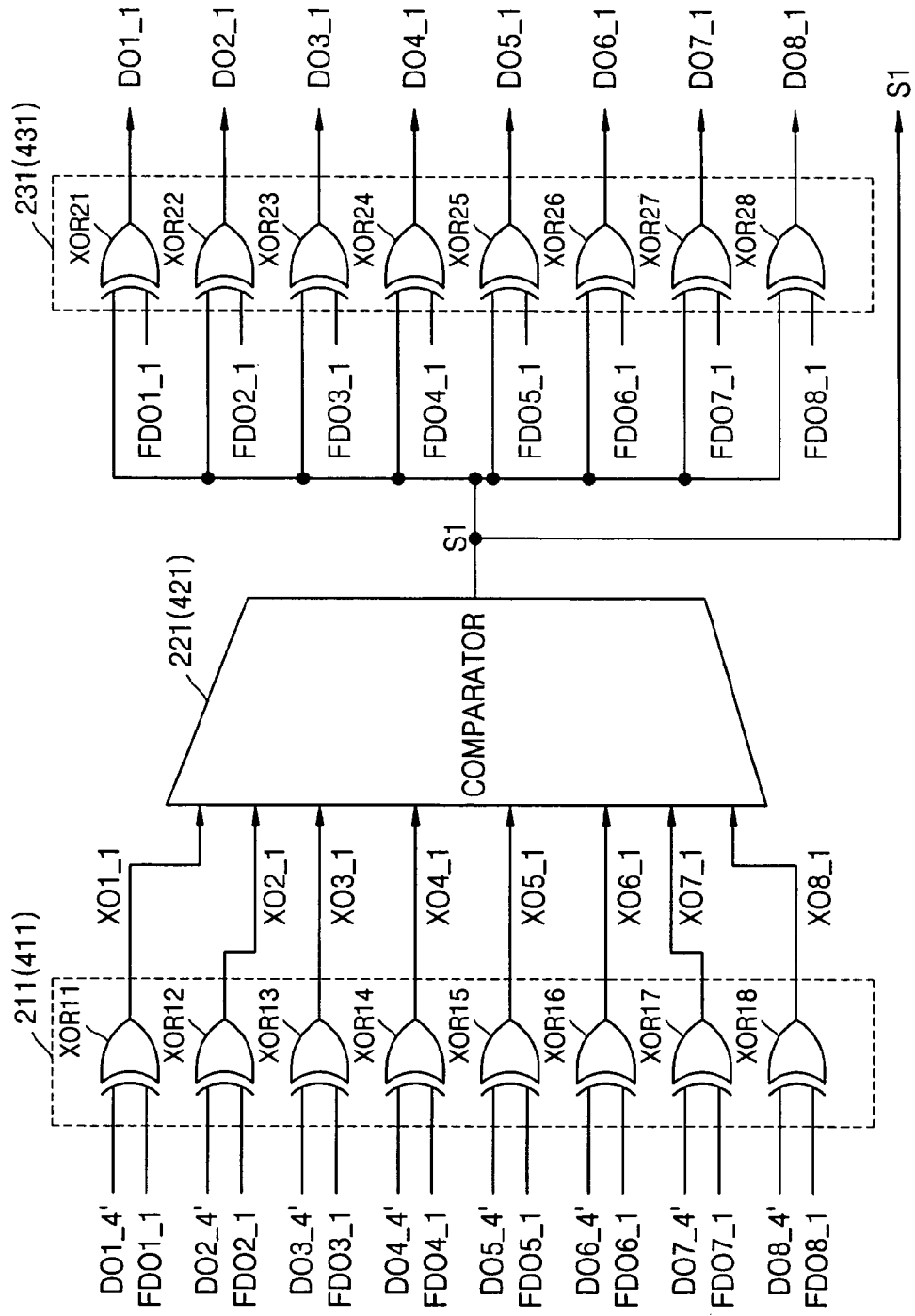
FIG. 4 is a detailed circuit diagram of a first inversion circuit shown in FIG. 3.

The first inversion circuit 201 will be described in more detail with reference to FIG. 4. As shown in FIG. 4, the first logic circuits 211 and second logic circuit 231 of the first inversion circuit 201 include 8 XOR gates XOR11 through XOR18 and XOR21 through XOR28, respectively. Here, the number of XOR gates included in the first logic circuit 211 and second logic circuit 231 is different according to the number of bits included in one among data simultaneously pre-fetched.

The XOR gates XOR11 through XOR18 of the first logic circuit 211 performs XOR operations of first input data FDO1_1 through FDO8_1 of 8 bits and the fourth output data DO1_4' through DO8_4' of 8 bits output from the fourth inversion circuit 204 during the previous clock cycle, to thereby output internal logic signals XO1_1 through XO8_1. In more detail, the XOR gates XOR11 through XOR18 outputs the internal logic signals XO1_1 through XO8_1 in a low level when the first input data FDO1_1 through FDO8_1 are the same as the fourth output data DO_4' through DO8_4'. Also, the XOR gates XOR11 through XOR18 output the internal logic signals XO1_1 through XO8_1 in a high level when the first input data FDO1_1 through FDO8_1 are different from the fourth output data DO1_4' through DO8_4', that is, when bits of the first input data FDO1_1 through FDO8_1 are toggled with the corresponding bits of the fourth output data DO_4' through DO8_4'. For example, it is assumed that the first input data FDO1_1 through FDO8_1 is "10001111" and the fourth output data DO1_4' through DO8_4' is "11110000". In this case, the XOR gate XOR11 outputs the internal logic signal XO1 in a low level and the XOR gates XOR12 through XOR18 output the internal logic signals XO2_1 through XO8_1 in a high level.

The comparator 221 receives the internal logic signals XO1_1 through XO8_1 and outputs a first flag signal S1 with a high level if half or more of the internal logic signals XO1_1 through XO8_1, that is, four or more of the internal logic signals XO1_1 through XO8_1 are in a high level. On the contrary, the comparator 221 outputs a first flag signal S1 with a low level if less than half of the internal logic signals XO1_1 through XO8_1, that is, three or less of the internal logic signals XO1_1 through XO8_1 are in a high level. Here, if the first flag signal S1 is in the high level, this means that the number of toggled bits of the first input data FDO1_1 through FDO8_1 and the fourth output data DO1_4' through DO8_4' is half or more of the number of total bits.

XOR gates XOR21 through XOR28 of the second logic circuit 231 performs XOR operations of the first input data FDO1_1 through FDO8_1 and the first flag signal S1 and outputs first output data DO1_1 through DO8_1 of 8 bits. Here, if the first flag signal S1 is in the high level, the first output data DO1_1 through DO8_1 are the same as inverted values of the first input data FDO1_1 through FDO8_1. Also, the first flag signal S1 is in the low level, the first output data DO1_1 through DO8_1 are the same as the first input data FDO1_1 through FDO8_1.

Figure 5:
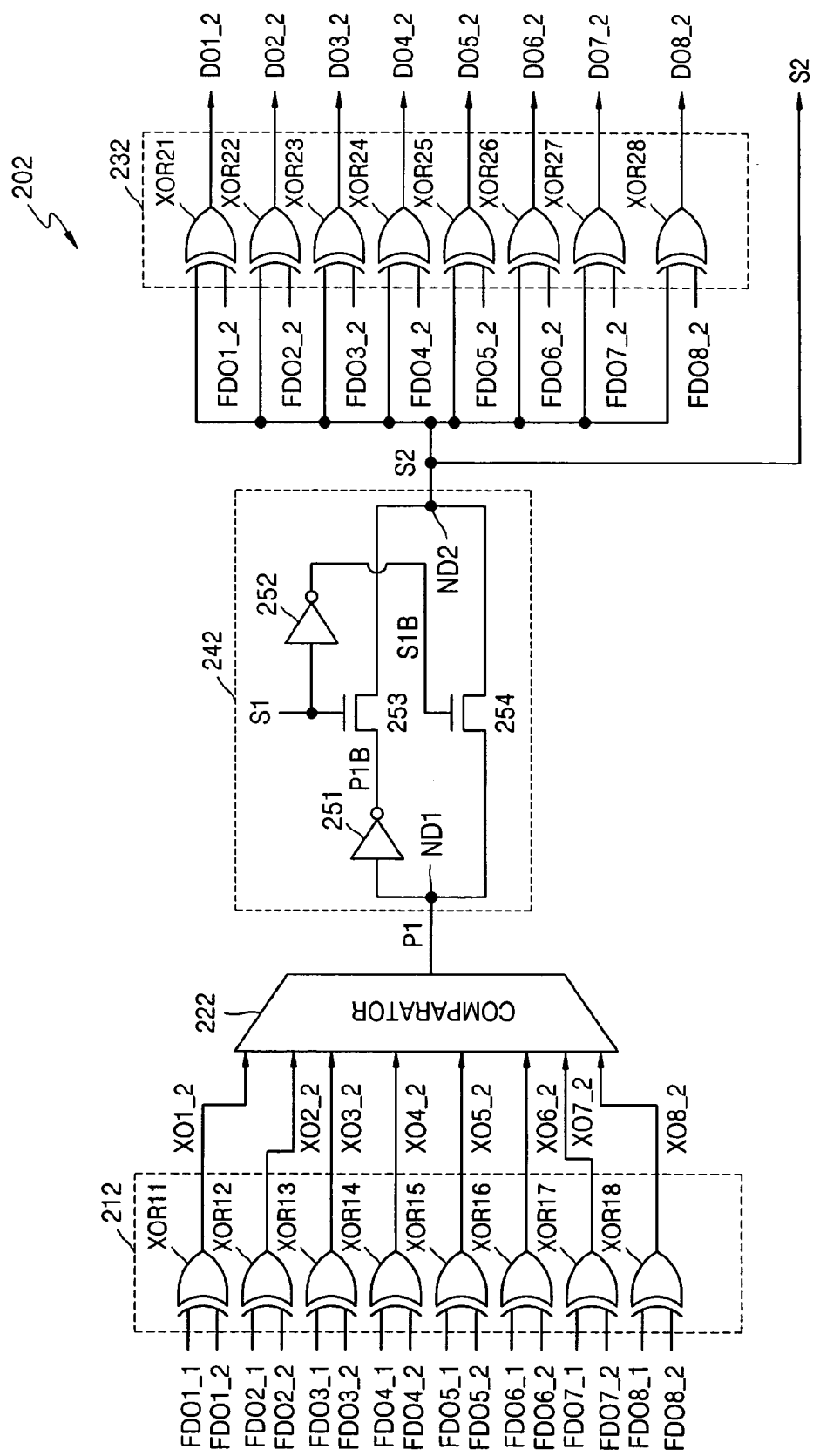
FIG. 5 is a detailed circuit diagram of a second inversion circuit shown in FIG. 3.

Next, the second inversion circuit 202 will be described in more detail with reference to FIG. 5. Referring to FIG. 5, the first logic circuit 212 and the second logic circuit 232 of the second inversion circuit 202 includes 8 XOR gates XOR11 through XOR18 and XOR21 through XOR28, respectively. The XOR gates XOR11 through XOR18 of the first logic circuit 212 performs XOR operations of the first input data FDO1_1 through FDO8_1 and the second input data FDO1_2 through FDO8_2 and outputs internal logic signals XO1_1 through XO8_2. Here, the XOR gates XOR11 through XOR18 of the first logic circuit 212 operate in the same manner as the XOR gates XOR11 through XOR18 of the first logic circuit 211 shown in FIG. 4 and therefore the detailed description thereof is omitted.

The comparator 222 receives the internal logic signals XO1_2 through XO8_2 and outputs a first internal flag signal P1 with a high level to a first node ND1 if half or more of the internal logic signals XO1_2 through XO8_2, that is, four or more of the internal logic signals XO1_2 through XO8_2 are in a high level. On the contrary, if less than half of the internal logic signals XO1_2 through XO8_2, that is, three or less of the internal logic signals XO1_2 through XO8_2 are in a high level, the comparator 222 outputs the first flag signal P1 with the low level to the first node ND1. Here, if the first internal flag signal P1 is in the high level, this means that the number of toggled bits of the first input data FDO1_1 through FDO8_1 and the second input data FDO1_2 through FDO8_2 is half or more of the number of total bits.

The flag signal generator 242 of the second inversion circuit 202 includes inverters 251 and 252 and switches 253 and 254. In FIG. 5, the switches 253 and 254 are NMOS transistors. The inverter 251 inverts a first internal flag signal P1 output from the first node ND1 and outputs an inverted first internal flag signal P1B. The inverter 252 inverts a first flag signal S1 output from the comparator 221 of the first inversion circuit 201 and outputs an inverted first flag signal S1B.

The drain of the NMOS transistor 253 is connected to an output terminal of the inverter 251 and the source thereof is connected to a second node ND2. Also, the first flag signal S1 is input to the gate of the NMOS transistor 253. The drain of the NMOS transistor 254 is connected to the first node ND1 and the source thereof is connected to the second node ND2. Also, the inverted first flag signal S1B is input to the gate of the NMOS transistor 254.

The NMOS transistor 253 is turned on or off in response to the first flag signal S1 and the NMOS transistor 254 is turned on or off in response to the inverted first flag signal S1B. That is, if the first flag signal S1 is in a high level, the NMOS transistor 253 is turned on and the NMOS transistor 254 is turned off. On the contrary, if the first flag signal S1 is in a low level, the NMOS transistor 253 is turned off and the NMOS transistor 254 is turned on.

If the NMOS transistor 253 is turned on, the inverted first internal flag signal P1B as a second flag signal S2 is output to the second node ND2, and if the NMOS transistor 254 is turned on, the first internal flag signal P1 as the second flag signal S2 is output to the second node ND2.

As a result, the flag signal generator 242 inverts and outputs the first internal flag signal P1 or outputs the first internal flag signal P1 without inversion, as the second flag signal S2, according to the level of the first flag signal S1.

The XOR gates XOR21 through XOR28 of the second logic circuit 232 performs an XOR operation of the first input data FDO1_1 through FDO8_1 and the second flag signal S2 and outputs second output data DO1_2 through DO8_2. Here, if the second flag signal S2 is in a high level, the second output data DO1_2 through DO8_2 are the same as inverted values of the first input data FDO1_1 through FDO8_1. Also, if the second flag signal S2 is in a low level, the second output data DO1_2 through DO8_2 is the same as the first input data FDO1_1 through FDO8_1.

Here, the third and fourth inverse circuits 203 and 204 operate in the same manner as the second inverse circuit 202.

Figure 6:
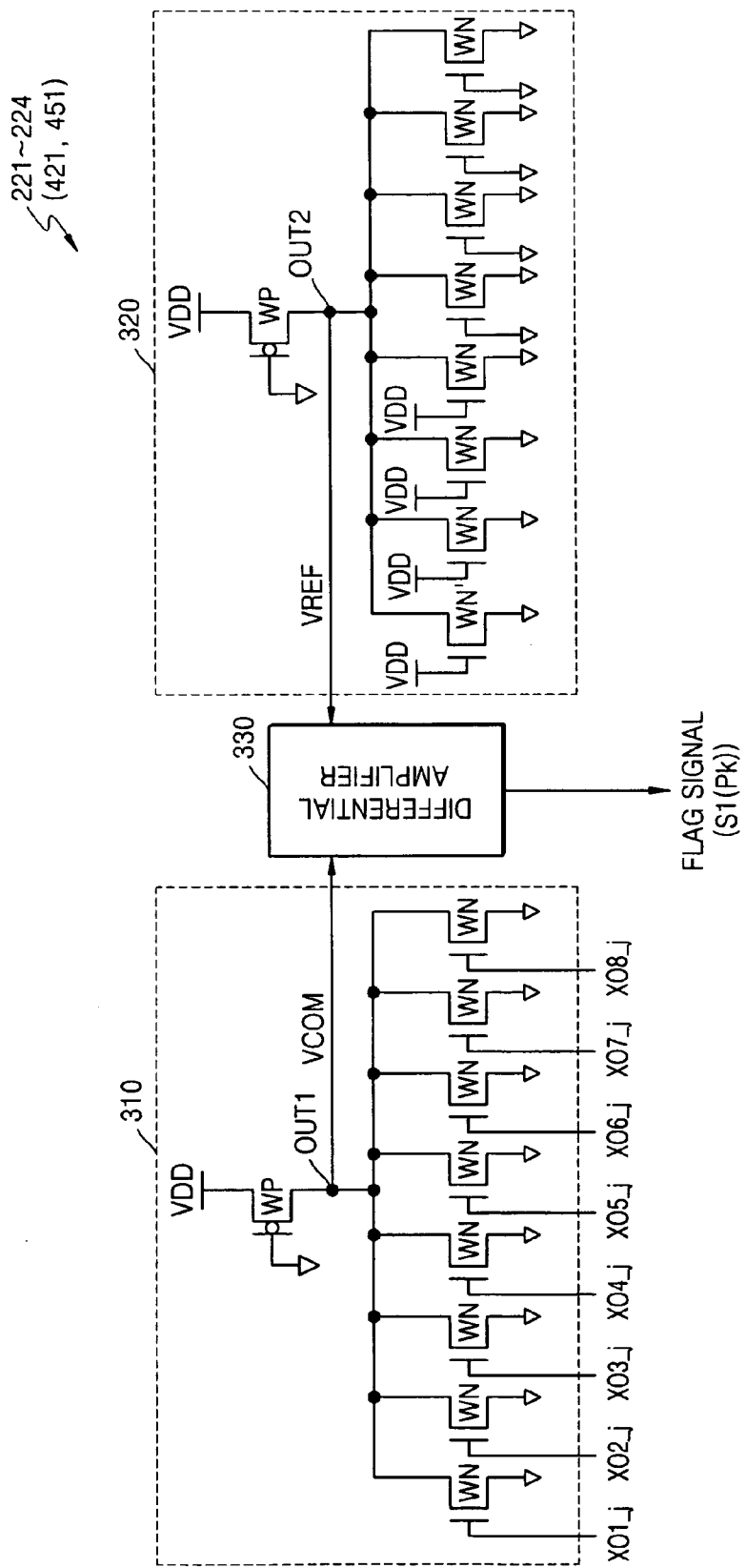
FIG. 6 is a circuit diagram illustrating an example of a comparator shown in FIG. 3.

Next, the comparators 221 through 224 shown in FIG. 3 will be described in more detail with reference to FIG. 6. Referring to FIG. 6, the comparators 221 through 224 include a comparison voltage generator circuit 310, a reference voltage generator circuit 320, and a differential amplifier 330, respectively.

The comparison voltage generator circuit 310 generates a comparison voltage VCOM in response to internal logic signals XO1_j through XO8_j (j=1 through 4) output respectively from the first logic circuits 211 through 214 and outputs the comparison voltage VCOM to an output node OUT1. The comparison voltage generator circuit 310 includes a PMOS transistor WP and 8 NMOS transistors WN.

The source of the PMOS transistor WP is connected to an internal voltage VDD, the gate thereof is connected to a ground voltage, and the drain thereof is connected to the output node OUT1. The drains of the 8 NMOS transistors WN are connected to the output node OUT1 and the sources thereof are connected to the ground voltage. Also, the internal logic signals XO1_j through XO8_j are input to the gates of the 8 NMOS transistors WN, respectively. The NMOS transistors WN are turned on or off in response to the internal logic signals XO1_j through XO8_j. Here, as the number of the turned-on NMOS transistors WN increases, the level of the comparison voltage VCOM decreases.

The reference voltage generator circuit 320 generates a predetermined reference voltage VREF and outputs the generated reference voltage VREF to an output node OUT2. The reference voltage generator circuit 320 includes a PMOS transistor WP and 8 NMOS transistors WN and WN'. The source of the PMOS transistor WP is connected to the internal voltage VDD, the gate thereof is connected to the ground voltage, and the drain thereof is connected to the output node OUT2. The drains of the 8 NMOS transistors WN and WN' are connected to the output node OUT2 and the sources thereof are connected to the ground voltage. The gates of four NMOS transistors WN among the 8 NMOS transistors WN and WN' are connected to the ground voltage and the gates of the remaining four NMOS transistors WN and WN' are connected to the internal voltage VDD. Here, the size of the NMOS transistor WN' are set to about ½ of those of the other NMOS transistors WN.

The level of the reference voltage VREF is decided by the NMOS transistors WN and WN' whose gates are connected to the internal voltage VDD. That is, the reference voltage VREF is a voltage generated at the output node OUT2 when three of the NMOS transistors WN and the NMOS transistor WN' each having the ½ size of the NMOS transistor WN are turned on.

Accordingly, when at least four NMOS transistors WN are turned on in the comparison voltage generator circuit 310, the level of the comparison voltage VCOM becomes less than that of the reference voltage VREF.

The differential amplifier 330 compares the comparison voltage VCOM with the reference voltage VREF and outputs a flag signal S1 (or Pk, k=1 through 3). In more detail, the differential amplifier 330 outputs the flag signal S1 (or Pk) with a high level when the comparison voltage VCOM is less than the reference voltage VREF. Also, the differential amplifier 330 outputs a flag signal S1 (or Pk) with a low level when the comparison voltage VCOM is larger than the reference voltage VREF.

Next, the operation of a data inversion circuit 200 according to an embodiment of the present invention is described with reference to FIGS. 3 through 6. Table 1 lists exemplary values of the fourth output data DOi_4' output during the previous cycle and the first through fourth input data FDOi_1 through FDOi_4 simultaneously pre-fetched.

TABLE 1

| Data | Bit value | | | | | | | |
|---|---|---|---|---|---|---|---|---|
| | i = 1 | i = 2 | i = 3 | i = 4 | 1 = 5 | i = 6 | i = 7 | i = 8 |
| DOi_4' | 1 | 1 | 0 | 0 | 0 | 0 | 1 | 1 |
| FDOi_1 | 1 | 1 | 1 | 1 | 1 | 1 | 0 | 0 |
| FDOi_2 | 1 | 1 | 1 | 1 | 1 | 1 | 0 | 1 |
| FDOi_3 | 1 | 0 | 0 | 0 | 0 | 0 | 0 | 1 |
| FDOi_4 | 1 | 0 | 0 | 0 | 0 | 0 | 1 | 0 |

Referring to FIG. 3, each of the first logic circuits 211 through 214 of the first through fourth inverse circuits 201 through 204 receive two neighboring data in the output order, performs a XOR operation of the two neighboring data, and outputs internal logic signals XOi_1 through XOi_4.

The output order is an order when the first through fourth input data FDOi_1 through FDOi_4 are output outside the semiconductor memory device 100 after the first through fourth input data FDOi_1 through FDOi_4 are subjected to inversion/non-inversion by the data inversion circuit 200. In FIG. 3, the inverted or non-inverted first through fourth input data FDOi_1 through FDOi_4 are output outside the semiconductor memory device 100 in an order of the first input data FDOi_1, the second input data FDOi_2, the third input data FDOi_3, and the fourth input data FDOi_4. Accordingly, the two data neighboring in the output order are the first input data FDOi_1 and the second input data FDOi_2, the second input data FDOi_2 and the third input data FDOi_3, and the third input data FDOi_3 and the fourth input data FDOi_4, respectively. The first logic circuits 212 through 214 receive the two neighboring data, respectively.

Also, since the fourth output data DOi_4' has been output during the previous clock cycle, the output order of the fourth output data DOi_4' is prior to that of the first input data FDOi_1. Accordingly, the first logic circuit 211 receives the fourth output data DOi_4' and the first input data FDOi_1.

The first logic circuits 211 through 214 operate at the same time. That is, the first logic circuits 212 through 214 operate when the first logic circuit 211 operates.

The internal logic signals XOi_1 through XOi_4 indicate how many the corresponding bits of the two neighboring data input to the first logic circuits 211 through 214 are toggled to each other.

Referring to FIG. 4, the XOR gates XOR11 through XOR18 of the first logic circuit 211 perform an XOR operation of "11000011" as the fourth output data DO1_4' through DO8_4' and "11111100" as the first input data FDO1_1 through FDO8_1. Here, since the remaining bits except for the bits DO1_4' and DO2_4' of the fourth output data are toggled with all bits except for FDO1_1 and FDO2_1 of the first input data, the XOR gates XOR11 through XOR18 output "00111111" as the internal logic signals XO1_1 through XO8_1.

Referring to FIG. 5, the XOR gates XOR11 through XOR18 of the first logic circuit 212 perform an XOR operation of "11111100" as the first input data FDO1_1 through FDO8_1 and "11111101" as the second input data FDO1_2 through FDO8_2. Here, since only the bits FDO8_1 of the first input data are toggled with the bits FDO8_2 of the second input data, the XOR gates XOR11 through XOR18 output "00000001" as internal logic signals XO1_2 through XO8_2.

The first logic circuits 213 and 214 operate in the same manner as the first logic circuit 212 and output "01111100" as internal logic signals XO1_3 through XO8_3 and "00000011" as internal logic signals XO1_4 through XO8_4, respectively.

Then, the comparators 221 through 224 of the first through fourth inverse circuits 201 through 204 determine whether the number of toggled bits is half or more of the number of total bits on the basis of the internal logic signals XOi_1 through XOi_4, and output a flag signal S1 (or Pk) according to the determined result. Here, the comparators 221 through 224 operate at the same time.

In more detail, referring to FIG. 6, "00111111" as the internal logic signals XO1_1 through XO8_1 are input to the comparison voltage generator circuit 310 of the comparator 221. As a result, 6 NMOS transistors WN are turned on in the comparison voltage generator circuit 310 and the level of the comparison voltage VCOM output to the output node OUT1 becomes less than the reference voltage VREF. The differential amplifier 330 outputs a first flag signal S1 since the comparison voltage VCOM is less than the reference voltage VREF.

Also, "00000001" as the internal logic signals XO1_2 through XO8_2 are input to the comparison voltage generator circuit 310 of the comparator 222. As a result, only one NMOS transistor WN is turned on in the comparison voltage generator circuit 310 and the comparison voltage VCOM output to the output node OUT1 becomes larger than the reference voltage VREF. The differential amplifier 330 outputs a first internal flag signal P1 with a low level since the comparison voltage VCOM is larger than the reference voltage VREF.

The comparators 223 and 224 also operate in the same manner as the comparator 222 and output a second internal flag signal P2 with a high level and a third flag signal P3 with a low level, respectively.

Then, the flag signal generators 242 through 244 of the second through fourth inverse circuits 202 through 204 operate sequentially and generate second through fourth flag signals S2 through S4 sequentially. That is, the flag signal generator 242 generates the second flag signal S2, the flag signal generator 243 generates the third flag signal S3, and then the flag signal generator 244 generates the fourth flag signal S4.

In more detail, referring to FIG. 5, since the first flag signal S1 is in a high level, the NMOS transistor 253 of the flag signal generator 242 is turned on and the NMOS transistor 254 is turned off. As a result, the flag signal generator 242 inverts the first internal flag signal P1 with the low level and outputs an inverted first internal flag signal P1B as S2 with a high level.

The flag signal generators 243 and 244 operate in the same manner as the flag signal generator 242 and output a third flag signal S3 with a low level and a fourth flag signal S4 with a low level, respectively.

Here, the internal logic signals XOi_1 through XOi_4, the first through fourth flag signals S1 through S4, and the first through third internal flag signals P1 through P3, which are generated by the data inversion circuit 200, are listed in Table 2.

TABLE 2

| | Logic level | | | | | | | |
|---|---|---|---|---|---|---|---|---|
| Signal | i = 1 | i = 2 | i = 3 | i = 4 | i = 5 | i = 6 | i = 7 | i = 8 |
| XOi_1 | 0 | 0 | 1 | 1 | 1 | 1 | 1 | 1 |
| XOi_2 | 0 | 0 | 0 | 0 | 0 | 0 | 0 | 1 |
| XOi_3 | 0 | 1 | 1 | 1 | 1 | 1 | 0 | 0 |
| XOi_4 | 0 | 0 | 0 | 0 | 0 | 0 | 1 | 1 |
| P1 | | | | | | 0 | | |
| P2 | | | | | | 1 | | |
| P3 | | | | | | 0 | | |
| S1 | | | | | | 1 | | |
| S2 | | | | | | 1 | | |
| S3 | | | | | | 0 | | |
| S4 | | | | | | 0 | | |

Next, the second logic circuits 231 through 234 of the first through fourth inversion circuits 201 through 204 invert and output the first through fourth input data FDOi_1 through FDOi_4 or output the first through fourth input data FDOi_1 through FDOi_4 without inversion, as the first through fourth output data DOi_1 through DOi_4, in response to the first through fourth flag signals S1 through S4. Here, the second logic circuits 231 through 234 operate sequentially. Accordingly, the first output data DOi_1, the second output data DOi_2, the third output data DOi_3, and the fourth output data DOi_4 are sequentially output.

Referring to FIG. 4, the XOR gates XOR21 through XOR28 of the second logic circuit 231 perform an XOR operation of "11111100" as the first input data FDO1_1 through FDO8_1 and the first flag signal S1 with the high level. Since the first flag signal S1 is in a high level, the XOR gates XOR21 through XOR28 of the second logic circuit 231 output an inverted value "00000011" of the first input data FDO1_1 through FDO8_1 as first output data DO1_1 through DO8_1. Referring to FIG. 5, the XOR gates XOR21 through XOR28 of the second logic circuit 232 perform a XOR operation of "11111101" as the second input data FDO1_2 through FDO8_2 and the second flag signal S2 with the high level. Since the first flag signal S2 is in a high level, the XOR gates XOR21 through XOR28 of the second logic circuit 232 output an inverted value "00000010" of the second input data FDO1_2 through FDO8_2 as second output data DO1_2 through DO8_2. The second logic circuit 233 also operates in the same manner as the second logic circuit 232 and outputs "10000001" of third input data FDO1_3 through FDO8_3, as third output data DO1_3 through DO8_3, without inversion. Also, the second logic circuit 234 also operates in the same manner as the second logic circuit 232 and outputs "10000010" of fourth input data FDO1_4 through FDO8_4, as fourth output data DO1_4 through DO8_4 without inversion. Here, the first through fourth DOi_1 through DOi_4 output data output by the second logic circuits 231 through 234 are listed in Table 3.

TABLE 3

| | Bit value | | | | | | | |
|---|---|---|---|---|---|---|---|---|
| Data | i = 1 | i = 2 | i = 3 | i = 4 | i = 5 | i = 6 | i = 7 | i = 8 |
| DOi_1 | 0 | 0 | 0 | 0 | 0 | 0 | 1 | 1 |
| DOi_2 | 0 | 0 | 0 | 0 | 0 | 0 | 1 | 0 |
| DOi_3 | 1 | 0 | 0 | 0 | 0 | 0 | 0 | 1 |
| DOi_4 | 1 | 0 | 0 | 0 | 0 | 0 | 1 | 0 |

It is seen in Table 3 that the number of toggled bits of the first through fourth output data DOi_1 through DOi_4 subjected to inversion/non-inversion by the data inversion circuit 200 is significantly reduced compared with the number of toggled bits of the first through fourth input data FDOi_1 through FDOi_4 listed in the above Table 1.

Figure 7:
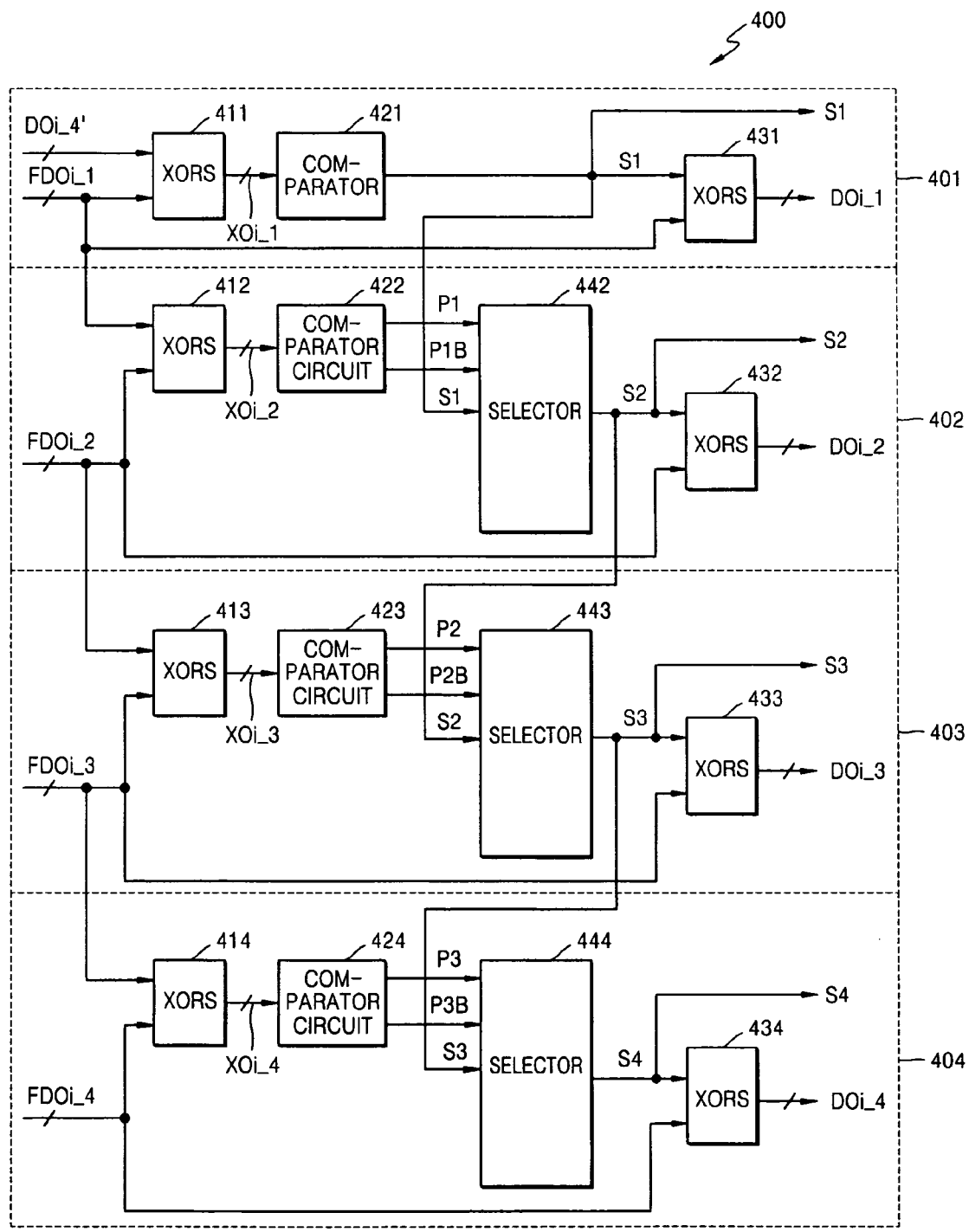
FIG. 7 is a detailed block diagram of the data inversion circuit shown in FIG. 2 according to another embodiment of the present invention.

FIG. 7 is a detailed block diagram of the data inversion circuit shown in FIG. 2 according to another embodiment of the present invention. Referring to FIG. 7, the data inversion circuit 400 includes first through fourth inversion circuits 401 through 404. FIG. 7 shows an exemplary data inversion circuit 400 including 4 inversion circuits based on a 4-bit pre-fetch scheme. Here, the first inversion circuit 401 operates in the same manner as the first inversion circuit 201 shown in FIGS. 3 and 4 and therefore the detailed description thereof is omitted. Also, the second through fourth inversion circuits 402 through 404 operate in the same manner as the second through fourth inversion circuits shown in FIG. 3 except for the following differences.

A first difference is in that the comparators 221 through 224 of the second through fourth inversion circuits 202 through 204 output the first through third internal flag signals P1 through P3, however, the comparison circuits 422 through 424 of the second through fourth inversion circuits 402 through 404 output first through third complementary internal flag signals P1, P1B through P3, and P3B. A second difference is in that the second through fourth inversion circuits 202 through 204 include the flag signal generators 242 through 244, however, the second through fourth inversion circuits 402 through 404 include selectors 442 through 444.

Figure 8:
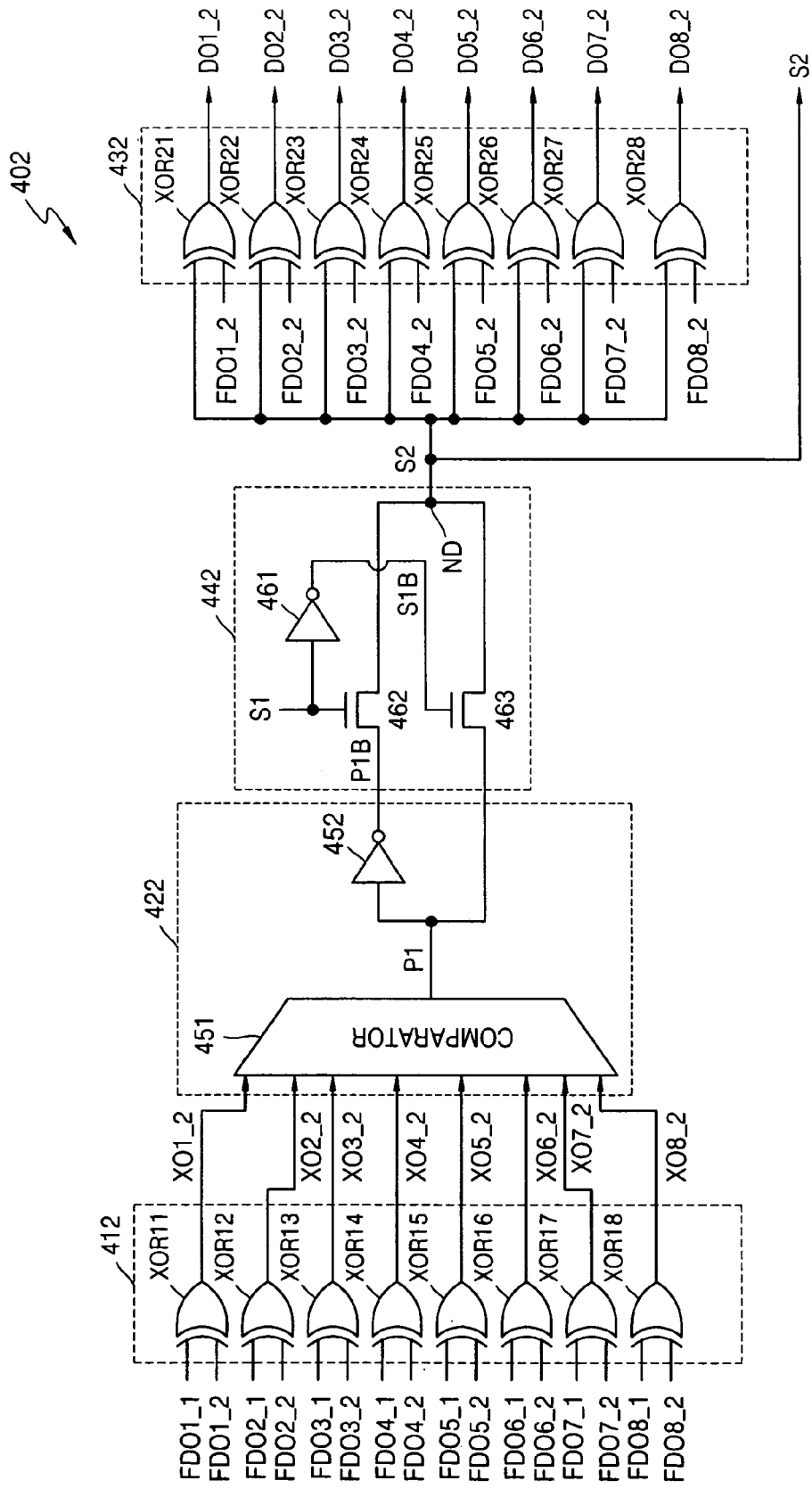
FIG. 8 is a detailed circuit diagram of a second inversion circuit shown in FIG. 7.

Referring to FIG. 8, the second through fourth inversion circuits 402 through 404 are described in more detail based on the two differences. FIG. 8 is a detailed circuit diagram of the second inversion circuit shown in FIG. 7. Here, the third and fourth inversion circuits 403 and 404 operate in the same manner as the second inversion circuit 402 and therefore in FIG. 8 the description will be given based on the second inversion circuit 402. The first logic circuit 412 and second logic circuit 432 of the second inversion circuit 402 include 8 XOR gates XOR11 through XOR18 and XOR21 through XOR28, respectively. The XOR gates XOR11 through XOR18 of the first logic circuit 412 perform a XOR operation of the first input data FDO1_1 through FDO8_1 and the second input data FDO1_2 through FDO8_2 and output internal logic signals XO1_2 through XO8_2.

The comparison circuit 422 includes a comparator 451 and an inverter 452. The comparator 451 receives the internal logic signals XO1_2 through XO8_2 and outputs a first internal flag signal P1 with a high level if half or more of the internal logic signals XO1_2 through XO8_2 are in a high level. On the contrary, if less than half (three or less) of the internal logic signals XO1_2 through XO8_2 are in a high level, the comparator 222 outputs a first internal flag signal P1 with a low level. Here, the comparators 451 operate in the same manner as the comparators 221 through 224 shown in FIG. 6 and therefore the detailed description thereof is omitted. The inverter 452 inverts the first internal flag signal P1 and outputs an inverted first internal flag signal P1B.

The selector 442 of the second inversion circuit 402 includes an inverter 461 and switches 462 and 463. In FIG. 8, the switches 462 and 463 may be NMOS transistors. The inverter 461 inverts a first flag signal S1 output from the comparator 421 of the first inversion circuit 401 and outputs an inverted first flag signal S1B.

The drain of the NMOS transistor 462 is connected to the output terminal of the inverter 452 and the source is connected to a node ND. Also, the first flag signal S1 is input to the gate of the NMOS transistor 462. The drain of the NMOS transistor 463 is connected to the output terminal of the comparator 451 and the source is connected to the node ND. Also, the inverted first flag signal S1B is input to the gate of the NMOS transistor 463.

The NMOS transistor 462 is turned on or off in response to the first flag signal S1 and the NMOS transistor 463 is turned on or off in response to the inverted first flag signal S1B. That is, if the first flag signal S1 is in a high level, the NMOS transistor 462 is turned on and the NMOS transistor 463 is turned off. On the contrary, if the first flag signal S1 is in a low level, the NMOS transistor 462 is turned off and the NMOS transistor 453 is turned on.

If the NMOS transistor 462 is turned on, the inverted first internal flag signal P1B as a second flag signal S2 is output to the node ND. If the NMOS transistor 463 is turned on, the first internal flag signal P1 as the second flag signal S2 is output to the node ND. As a result, the selector 442 selects any one of the first internal flag signal P1 and the inverted first internal flag signal P1B according to the level of the first flag signal S1 and outputs the selected signal as the second flag signal S2.

The XOR gates XOR21 through XOR28 of the second logic circuit 432 perform an XOR operation of the second input data FDO1_2 through FDO8_2 and the second flag signal S2 and output second output data DO1_2 through DO8_2. Here, if the second flag signal S2 is in a high level, the second output data DO1_2 through DO8_2 are the same as an inverted value of the second input data FDO1_2 through FDO8_2. Also, if the second flag signal S2 is in a low level, the second output data DO1_2 through DO8_2 are the same as the second input data FDO1_2 through FDO8_2.

Figure 9:
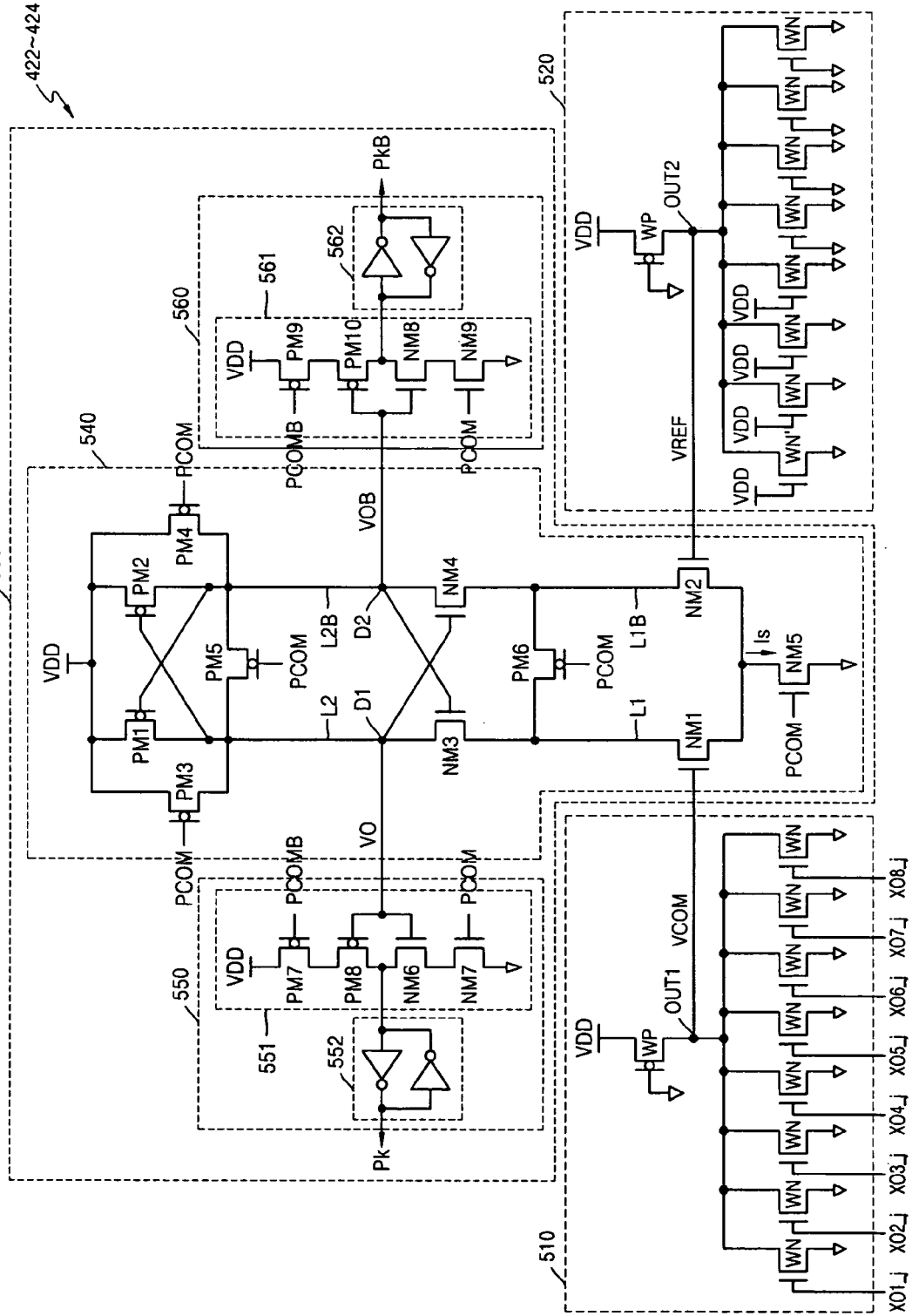
FIG. 9 is a circuit diagram illustrating an example of a comparison circuit shown in FIG. 7.

FIG. 9 is a circuit diagram illustrating an example of the comparison circuit shown in FIG. 7. Referring to FIG. 9, each of the comparison circuits 422 through 424 includes a comparison voltage generator circuit 510, a reference voltage generator circuit 520, and an internal flag signal generator circuit 530. Here, the comparison voltage generator circuit 510 and the reference voltage generator circuit 520 operate in the same manner as the comparison voltage generator circuit 310 and the reference voltage generator circuit 320 shown in FIG. 6 and therefore the detailed description thereof is omitted.

The internal flag signal generator circuit 530 includes a differential amplifier circuit 540 and output circuits 550 and 560. The differential amplifier circuit 540 includes differential NMOS transistors NM1 and NM2, amplifier PMOS transistors PM1 and PM2, amplifier NMOS transistors NM3 and NM4, reset PMOS transistors PM3 through PM6, and a current source NMOS transistor NM5.

The drains of the differential NMOS transistors NM1 and NM2 are connected to the first output lines L1 and L1B, respectively, and the comparison voltage VCOM and the reference voltage VREF are input respectively to the gates of the differential NMOS transistors NM1 and NM2. The differential NMOS transistors NM1 and NM2 compare the comparison voltage VCOM with the reference voltage VREF and output output signals VO and VOB to the first output lines L1 and L1B, respectively.

The amplifier PMOS transistors PM1 and PM2 are cross-coupled with the second output lines L2 and L2B and the sources of the amplifier PMOS transistors PM1 and PM2 are connected to the internal voltage VDD. The amplifier NMOS transistors NM3 and NM4 are also cross-coupled with the second output lines L2 and L2B and the sources of the amplifier NMOS transistors NM3 and NM4 are also connected to the first output lines L1 and L1B, respectively. The amplifier PMOS transistors PM1 and PM2 and the amplifier NMOS transistors NM3 and NM4 amplify the output signals VO and VOB transferred to the first output lines L1 and L1B and output the amplified results to the second output lines L2 and L2B. Accordingly, the amplified output signals VO and VOB are output respectively from nodes D1 and D2 of the second output lines L2 and L2B.

A control signal PCOM is input to the gates of the reset PMOS transistors PM3 through PM6. Here, the control signal PCOM is a signal generated from an additional control circuit (not shown) in response to a read command. The sources of the reset PMOS transistors PM3 and PM4 are connected to the internal voltage VDD and the drains thereof are connected to the second output lines L2 and L2B, respectively. The source and drain of the rest PMOS transistor PM5 are connected respectively to the second output lines L2 and L2B and the source and drain of the reset PMOS transistor PM6 are connected respectively to the first output lines L1 and L1B. The reset PMOS transistors PM3 through PM6 are turned on or off in response to the control signal PCOM. The reset PMOS transistors PM3 through PM6 precharge voltage levels of the first output lines L1 and L1B and the second output lines L2 and L2B to the level of the internal voltage VDD when turned on.

The drain of the current source NMOS transistor NM5 is connected to the sources of the differential NMOS transistors NM1 and NM2 and the source of the current source NMOS transistor NM5 is connected to the ground voltage. The control signal PCOM is input to the gate of the current source NMOS transistor NM5. The current source NMOS transistor NM5 is turned on or off in response to the control signal PCOM and controls the operations of the differential amplifier circuit 540 using a source current $I_s$.

The output circuits 550 and 560 include inverter circuits 551 and 561 and latch circuits 552 and 562, respectively. The inverter circuit 551 includes PMOS transistors PM7 and PM8 and NMOS transistors NM6 and NM7. The source of the PMOS transistor PM7 is connected to the internal voltage VDD and the drain thereof is connected to the source of the PMOS transistor PM8. A control signal PCOMB is input to the gate of the PMOS transistor PM7. The control signal PCOMB is an inverted signal of the control signal PCOM.

The gates of the PMOS transistor PM8 and the NMOS transistor NM6 are connected to the node D1. The drain of the NMOS transistor NM7 is connected to the source of the NMOS transistor NM6 and the source of the NMOS transistor NM7 is connected to the ground voltage. The control signal PCOM is input to the gate of the NMOS transistor NM7. Also, the drains of the PMOS transistor PM8 and the NMOS transistor NM6 are connected to the input terminal of the latch circuit 552. The inverter circuit 551 inverts the output signal VO output from the node D1 in response to the control signals PCOM and PCOMB. The latch circuit 552 latches an output signal of the inverter circuit 551 and outputs the latched signal as an internal flag signal $P_k$.

The inverter circuit 561 includes PMOS transistors PM9 and PM10 and NMOS transistors NM8 and NM9. The source of the PMOS transistor PM9 is connected to the internal voltage VDD and the drain thereof is connected to the source of the PMOS transistor PM10. Also, the control signal PCOMB is connected to the gate of the PMOS transistor PM9. The gates of the PMOS transistor PM10 and the NMOS transistor NM8 are connected to the node D2. The drain of the NMOS transistor NM9 is connected to the source of the NMOS transistor NM8 and the source of the NMOS transistor NM9 is connected to the ground voltage. The control signal PCOM is input to the gate of the NMOS transistor NM9. The drains of the PMOS transistor PM10 and the NMOS transistor NM8 are connected to the input terminal of the latch circuit 562. The inverter circuit 561 inverts the output signal VOB output from the node D2 in response to the control signals PCOM and PCOMB. The latch circuit 562 latches an output signal of the inverter circuit 561 and outputs the latched signal as an internal flag signal PkB. As a result, complementary internal flag signals Pk and PkB are output from the differential amplifier circuit 540.

Next, the operations of the comparison circuits 422 and 424 as described above are described. The comparison voltage generator circuit 510 generates a comparison voltage VCOM in response to the internal logic signals XO1_j through XO8_j. The reference voltage generator circuit 520 generates a predetermined reference voltage VREF. Here, if half or more (four or more) of the internal logic signals XO1_j through XO8_j are in a high level, the comparison voltage VCOM becomes less than the reference voltage VREF. On the contrary, if less than half (three or less) of the internal logic signals XO1_j through XO8_j are in a high level, the comparison voltage VCOM becomes larger than the reference voltage VREF. In FIG. 9, an example that half or more (four or more) of the internal logic signals XO1_j through XO8_j are in the high level is described. Accordingly, the comparison voltage VCOM becomes less than the reference voltage VREF.

Next, the control signal PCOM is enabled to be in a high level. In response to the control signal PCOM, the current source NMOS transistor NM5 of the differential amplifier circuit 540 is turned on and the reset PMOS transistors PM3 through PM6 are turned off. The differential NMOS transistors NM1 and NM2 compare the comparison voltage VCOM with the reference voltage VREF and output the output signals VO and VOB to the first output lines L1 and L1B, respectively. Here, since the comparison voltage VCOM is less than the reference voltage VREF, the value of a turn-on resistance of the differential NMOS transistor NM1 is greater than that of the differential NMOS transistor NM2. As a result, the voltage level of the output signal VOB becomes lower than the voltage level of the output signal VO.

The amplifier PMOS transistors PM1 and PM2 and the amplifier NMOS transistors NM3 and NM4 amplify the output signals VO and VOB transferred to the first output lines L1 and L1B and outputs the amplified signals to the second output lines L2 and L2B. Thereafter, an output signal VO with a high level is output from a node D1 of the second output line L2 and an output signal VOB with a low level is output from the node D2 of the second output line L2B.

The inverter circuits 551 and 561 of the output circuits 550 and 560 invert the output signals VO and VOB, respectively, in response to the control signals PCOM and PCOMB. Also, the latch circuits 552 and 562 of the output circuits 550 and 560 latch the output signals of the inverter circuits 551 and 561, respectively, and output the latched signals as internal flag signals Pk and PkB. That is, the latch circuit 552 latches an output signal with a low level output from the inverter circuit 551 and outputs an internal flag signal Pk with a high level. Also, the latch circuit 562 latches an output signal with a high level output from the inverter circuit 561 and outputs an internal flag signal PkB with a low level.

If the latch operations of the latch circuits 552 and 562 are complete, the control signal PCOM is disabled to be in a low level. In response to the control signal PCOM, the reset PMOS transistors PM3 through PM6 are turned on. The reset PMOS transistors PM3 through PM6 precharge voltage levels of the first output lines L1 and L1B and the second output lines L2 and L2B to the level of the internal voltage VDD for the next comparison operation of the differential amplifier circuit 540. Also, in response to the control signal PCOM, the current source NMOS transistor NM5 is turned off. Also, if the control signal PCOM is disabled to be in a low level, the PMOS transistors PM7 and PM9 and the NMOS transistors NM7 and NM9 are turned off and the inverter circuits 551 and 561 are disabled.

As a result, although the voltage levels of the second output lines L2 and L2B are precharged to the level of the internal voltage VDD, an output path from the nodes D1 and D2 to the latch circuits 552 and 562 is blocked by the inverter circuits 551 and 561. Accordingly, the output signals VO and VOB changed to the level of the internal voltage VDD do not have an influence on the internal flag signals Pk and PkB previously latched by the latch circuits 552 and 562.

Figure 10:
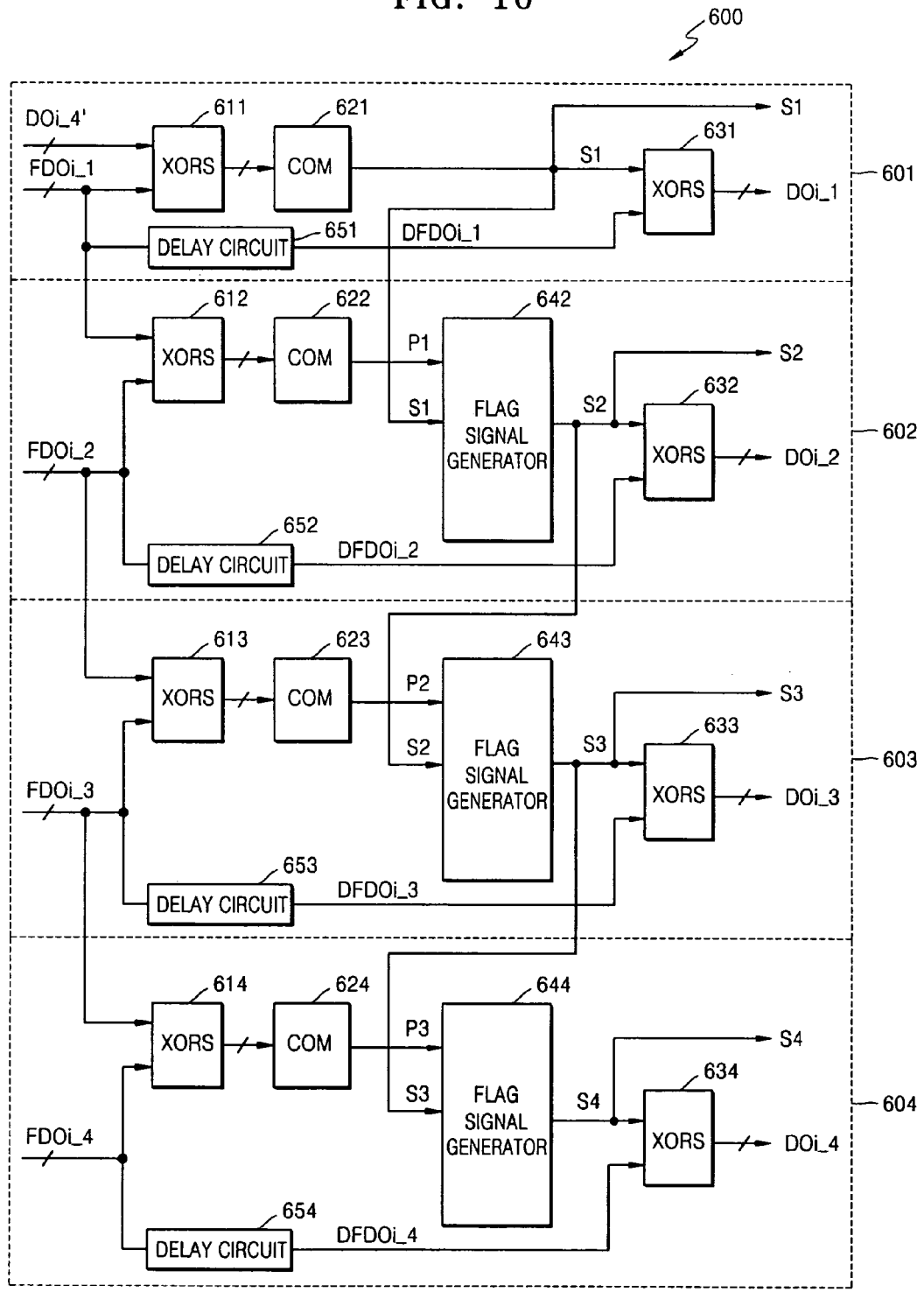
FIG. 10 is a detailed block diagram of the data inversion circuit shown in FIG. 2, according to another embodiment of the present invention.

FIG. 10 is a detailed block diagram of the data inversion circuit shown in FIG. 2, according to another embodiment of the present invention. Referring to FIG. 10, a data inversion circuit 600 includes first through fourth inversion circuits 601 through 604. Here, the first through fourth inversion circuits 601 through 604 operate in the same manner as the first through fourth inversion circuits 201 through 204 shown in FIG. 3 except for the following difference and therefore the detailed description thereof is omitted.

The difference is in that the first through fourth inversion circuits 601 through 604 further include delay circuits 651 through 654 compared with the first through fourth inversion circuits 201 through 204.

The delay circuits 651 through 654 delay first through fourth input data FDOi_1 through FDOi_4 respectively during a predetermined time and output the delayed first through fourth input data DFDOi_1 through DFDOi_4, respectively. In other words, the delay circuits 651 through 654 delays the first through fourth input data FDOi_1 through FDOi_4 during a time taken until first through fourth flag signals S1 through S4 are finally output from a comparator 621 and flag signal generators 642 through 644 after the first through fourth input data FDOi_1 through FDOi_4 are input to first logic circuits 611 through 614.

As a result, the first through fourth flag signals S1 through S4 and the delayed first through fourth input data DFDOi_1 through DFDOi_4 are input at the same time to the second logic circuits 631 through 634 of the first through fourth inversion circuits 601 through 604. Therefore, valid windows of two signals input respectively to the second logic circuits 631 through 634 can be maintained in a maximum value.

Here, it is preferable that the delay times of the delay circuits 651 through 654 are set differently to each other. For example, delay times of the delay circuits 651 through 654 are denoted by T1, T2, T3, and T4, respectively. Also, a delay time by the first logic circuits 611 through 614 is denoted by TD, a delay time by the comparators 621 through 624 is denoted by TC, a delay time by the flag signal generators 642 through 644 is denoted by TF. In this case, the delay times T1 through T4 are expressed by the following equations.

$$T1=TD+TC,$$

$$T2=T1+TF,$$

$$T3=T2+TF,$$

$$T4=T3+TF \quad (1)$$

As seen in the above equation 1, the delay times T1 through T4 of the delay circuits 651 through 654 have a relationship of T1<T2<T3<T4. That is, the delay times of the delay circuits 651 through 654 become longer in a direction from the delay circuit 651 toward the delay circuit 654. After a second flag signal S2 is output from the flag signal generator 642, the flag signal generator 643 outputs a third flag signal S3 according to a level of the second flag signal S2. Accordingly, the delay time T3 of the delay circuit 653 should be set to compensate for the delay time generated by the flag signal generators 642 and 643. Likewise, after the third flag signal S3 is output from the flag signal generator 643, the flag signal generator 644 outputs a fourth flag signal S4 according to a level of the third flag signal S3. Accordingly, the delay time T4 of the delay circuit 654 should be set to compensate for the delay time generated by the flag signal generators 642 through 644.

Figure 11A:
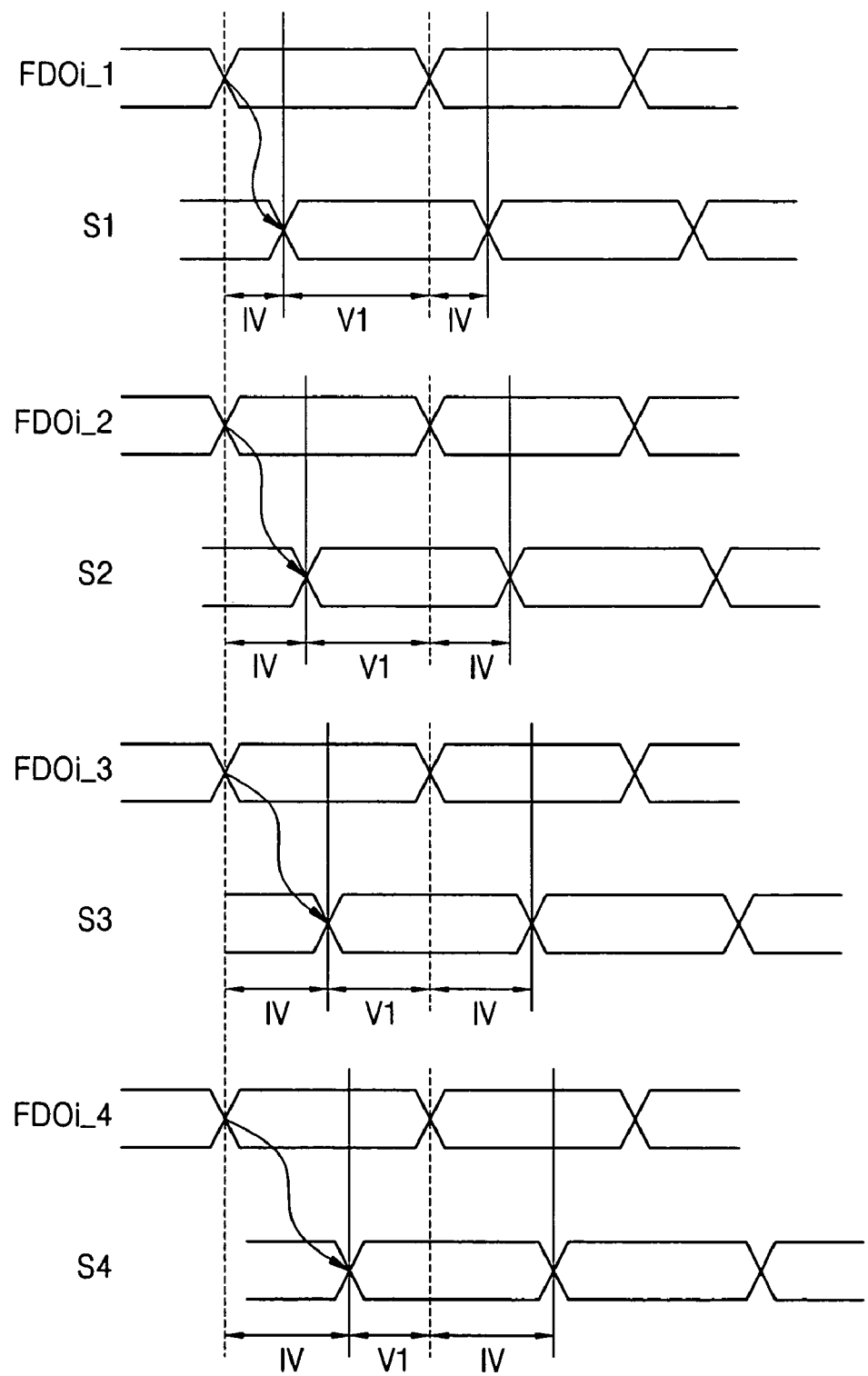
FIG. 11$a$ is a timing diagram for input signals of second logic circuits shown in FIG. 3.
Figure 11B:
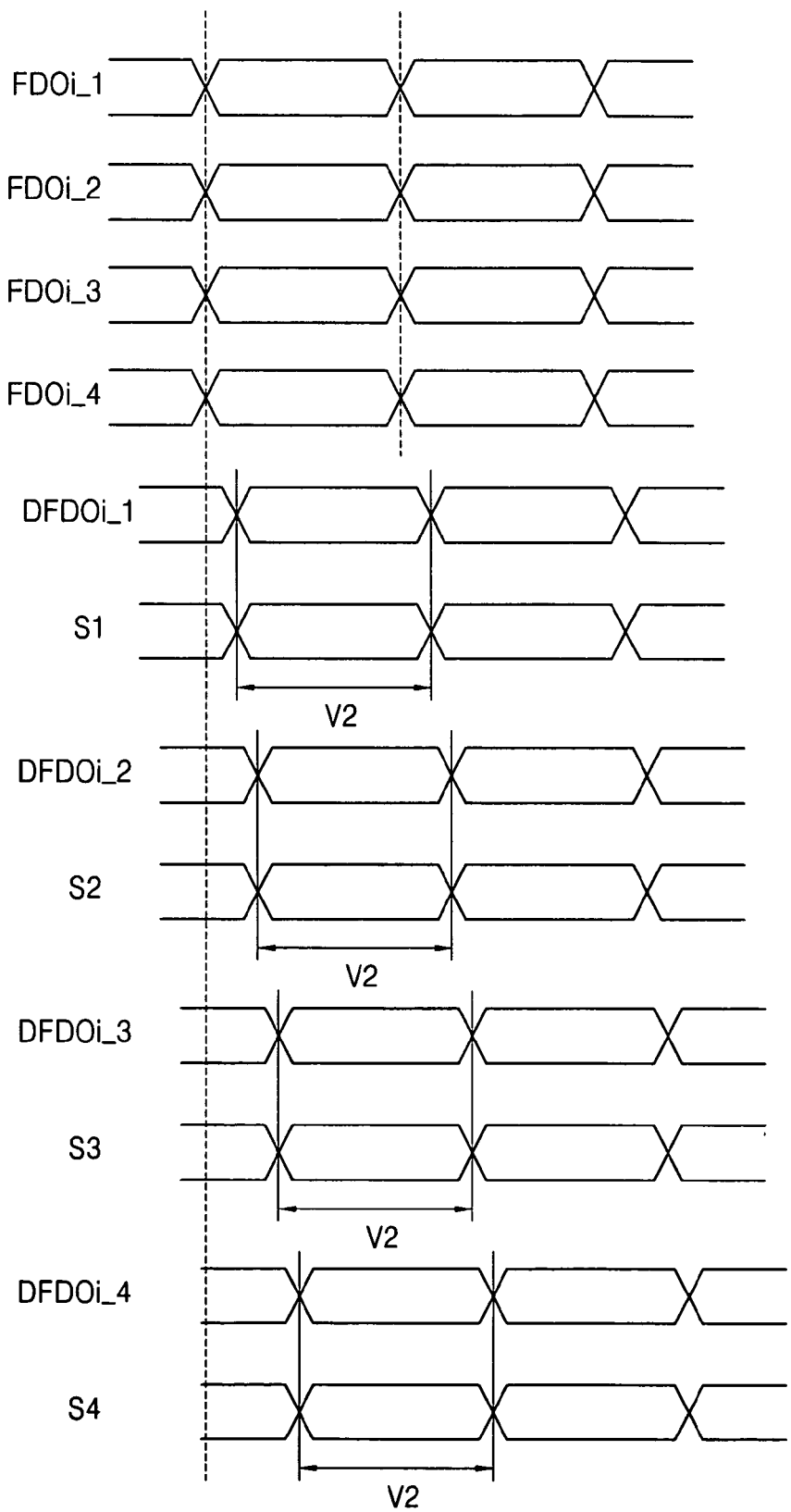

Next, referring to FIGS. 11a and 11b, valid window intervals of internal signals generated while the data inversion circuit 200 of FIG. 3 operates and valid window intervals of internal signals generated while the data inversion circuit 600 operates, are described. FIG. 11a is a timing diagram for input signals of the second logic circuits 231 through 234 shown in FIG. 3. FIG. 11b is a timing diagram for input signals of the second logic circuits 631 through 634 shown in FIG. 10.

Referring to FIG. 11a and FIG. 3, first through fourth input data FDOi_1 through FDOi_4 are input at the same time to the first logic circuits 211 through 214 and the second logic circuits 231 through 234. However, the first through fourth flag signals S1 through S4 are delayed by a time for which the first through fourth input data FDOi_1 through FDOi_4 are processed by the first logic circuits 211 through 214 and the comparators 221 through 224, and then are input to the second logic circuits 231 through 234. As a result, an invalid interval IV is generated between the first through fourth input data FDOi_1 through FDOi_4 and the first through fourth flag signals S1 through S4. Accordingly, a common valid interval V1 between the first through fourth input data FDOi_1 through FDOi_4 and the first through fourth flag signals S1 through S4, that is, a valid window interval is reduced. Such reduction of the valid window interval can limit an operating frequency of a semiconductor device.

On the contrary, in the data inversion circuit 600, the first through fourth input data FDOi_1 through FDOi_4 are delayed by the delay circuits 651 through 654. Accordingly, referring to FIG. 11b, the first through fourth flag signals S1 through S4 and delayed first through fourth input data DFDOi_1 through DFDOi_4 are input at the same time to the second logic circuits 631 through 634. As a result, no invalid interval is generated between the delayed first through fourth input data DFDOi_1 through DFDOi_4 and the first through fourth flag signals S1 through S4. Accordingly, a common valid interval V2 between the delayed first through fourth input data DFDOi_1 through DFDOi_4 and the first through fourth flag signals S1 through S4 can be ensured to be in a maximum value. Here, the delay circuits 651 through 654 are applicable to the data inversion circuit 400 shown in FIG. 7.

As described above, the data inversion circuit according to the present invention performs at the same time a process which determines how many of a plurality of data simultaneously pre-fetched are toggled with each other and a process which generates a flag signal according to the determined result. Actually, the data inversion circuit consumes a longest time to generate the flag signal. The data inversion circuit according to the present invention can significantly reduce a data processing time and accordingly can process data at a high speed in a semiconductor device with a multiple bit pre-fetch structure.

Also, according to embodiments of the present invention, an internal flag signal is inverted output or output without inversion according to how many bits of previous data are toggled with bits of present data, and the inverted or non-inverted internal flag signal is used as a flag signal for controlling inversion/non-inversion of the present data. Accordingly, it is possible to reduce a time taken for data inversion and improve an operating frequency of a semiconductor device, compared with the conventional technique which compares present data with previous data subjected to inversion/non-inversion.

Meanwhile, in the data inversion circuit, a logic circuit which determines whether data are toggled with each other and a comparator which generates flag signals according to the determined result consume many currents and occupy a large area. Accordingly, it is preferable that the data inversion circuit includes a small number of logic circuits and comparators. The data inversion circuit according to the present invention requires only a logic circuit and a comparator for each data to perform inversion/non-inversion for each of a plurality of data simultaneously pre-fetched. Accordingly, the data inversion circuit according to the present invention occupies a minimum area and can process data at a high speed.

Effects of the present invention as described above are more obvious when compared with a comparative example of the present invention.

Figure 12:
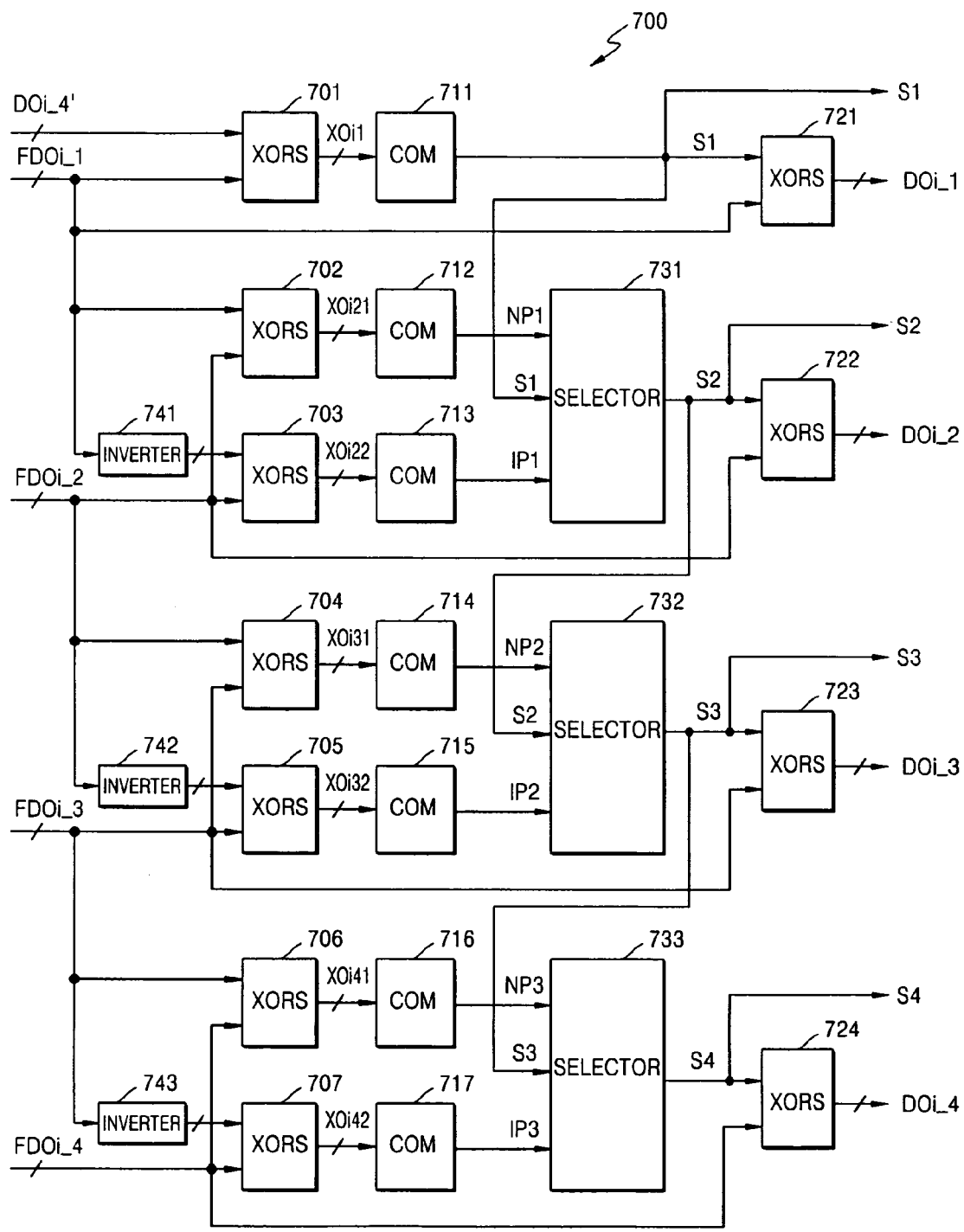
FIG. 12 is a block diagram of a comparative data inversion circuit.

FIG. 12 is a block diagram of a data inversion circuit according to a comparative example of the present invention. Referring to FIG. 12, the data inversion circuit 700 includes first logic circuits 701 through 707, comparators 711 through 717, second logic circuits 721 through 724, selectors 731 through 733, and inverters 741 through 743.

Here, the first logic circuit 701, the comparator 711, and the second logic circuits 721 through 724 operate in the same manner as the first logic circuit 211, the comparator 221, and the second logic circuits 231 through 234 shown in FIG. 3, and therefore the detailed descriptions thereof are omitted.

The data inversion circuit 700 uses two first logic circuits and two comparators for generating the second through the fourth flag signals S2 through S4. For example, the first logic circuits 702 through 703 and the comparators 712 and 713 are required to generate a second flag signal S2. Here, since the third and fourth flag signals S3 and S4 are generated in the same manner as the generation of the second flag signal S2, in FIG. 12, a process for generating the second flag signal S2 is described.

The first logic circuit 702 receives first input data FDOi_1 with 8 bits and second input data FDOi_2 with 8 bits, determines how many bits of the first input data FDOi_1 are toggled with corresponding bits of the second input data FDOi_2, and outputs an internal logic signal XOi21 as the determined result. The comparator 712 receives the internal logic signal XOi21, determines whether the number of the toggled bits is four or more, and outputs a non-inverted flag signal NP1 with a high level or with a low level according to the determined result.

Also, the first logic circuit 703 receives inverted data of the first input data FDOi_1 with 8 bits, inverted by the inverter 741, and the second input data FDOi_2 with 8 bits, determines how many bits of the inverted data are toggled with corresponding bits of the second input data FDOi_2, and outputs an internal logic signal XOi22 as the determined result. The comparator 713 receives the internal logic signal XOi22, determines whether the number of the toggled bits is four or more, and outputs an inverted flag signal IP1 with a high level or with a low level according to the determined result.

The selector 731 selects any one among the non-inverted flag signal NP1 and the inverted flag signal IP1 in response to a first flag signal S1 output from the comparator 711 and outputs the selected signal as a second flag signal S2. In more detail, the selector 341 outputs an inverted flag signal IP1 as a second flag signal S2 if the first flag signal S1 is in a high level and outputs a non-inverted flag signal NP1 as a second flag signal S2 if the first flag signal S1 is in a low level.

As described above, the data inversion circuit according to the comparative example of the present invention requires two logic circuits, two comparators, and inverters to generate a flag signal for controlling inversion/non-inversion of data to be currently output. Accordingly, the data inversion circuit consumes more currents and occupies a larger area compared with the data inversion circuit of the present invention. Moreover, according to a data inversion circuit and method of the present invention, it is possible to process data at a high speed and reduce current consumption and an occupied area of devices. Also, the data inversion circuit and method according to the present invention can prevent valid windows of internal signals from being reduced.

While the present invention has been particularly shown and described with reference to exemplary embodiments thereof, it will be understood by those of ordinary skill in the art that various changes in form and details may be made therein without departing from the spirit and scope of the present invention as defined by the following claims. For example, the above-described embodiments are described based on a 4-bit pre-fetch scheme, however, the number of bits to be pre-fetched is changeable. Also, it is determined whether data is inverted for each of 8 bits in the above-described embodiment, however, this is also changeable.

What is claimed is:

1. An integrated circuit device, comprising:
a data inversion circuit that is configured to evaluate bit differences between first and second ordered groups of data received in parallel at inputs thereof by performing bit-to-bit comparisons between corresponding bits in the first and second ordered groups of data and is further configured to generate versions of the first and second ordered groups of data in parallel at outputs thereof, wherein the version of the second ordered group of data is an inverted version of the second ordered group of data when a number of bit differences between the version of the first ordered group of data and the second ordered group of data is greater than one-half the number of bits of data within the second ordered group of data, said data inversion circuit comprising an XOR circuit that is configured to receive the first and second ordered groups of data, a comparator that is configured to generate a first internal parity signal in response to signals generated by said XOR circuit and a parity signal generator that is configured to generate a second external parity signal in response to a first external parity signal and the first internal parity signal.

2. The device of claim 1, wherein said comparator is configured to generate a pair of complementary internal parity signals in response to signals generated by said XOR circuit.

3. The device of claim 2, wherein said parity signal generator is configured to select a first one of the pair of complementary internal parity signals as the second external parity signal when the first external parity signal is in a first logic state and is further configured to select a second one of the pair of complementary internal parity signals as the second external parity signal when the first external parity signal is in a second logic state opposite the first logic state.

4. The device of claim 1, wherein the first external parity signal identifies whether the version of the first ordered group of data is an inverted or noninverted version of the first ordered group of data and the second external parity signal identifies whether the version of the second ordered group of data is an inverted or noninverted version of the second ordered group of data.

5. The device of claim 1, wherein said parity signal generator is configured to generate a pair of complementary internal parity signals in response to the first internal parity signal.

6. An integrated circuit device, comprising:
a data inversion circuit that is configured to evaluate bit differences between first and second ordered groups of data received in parallel at inputs thereof by performing bit-to-bit comparisons between corresponding bits in the first and second ordered groups of data and is further configured to generate a version of the first ordered group of data in parallel with an inverted version of the second ordered group of data at outputs thereof when a number of bit differences between the version of the first ordered group of data and the second ordered group of data is greater than one-half the number of bits of data within the second ordered group of data, said data inversion circuit comprising a plurality of parity signal generators that are configured to generate at least a first external parity signal that identifies whether the version of the first ordered group of data is an inverted or noninverted version of the first ordered group of data.

7. The device of claim 6, wherein said data inversion circuit comprises at least one delay circuit that is configured to generate a delayed version of the first ordered group of data in response to the first ordered group of data and is further configured to generate the version of the first ordered group of data at an output of said data inversion circuit in response to the delayed version of the first ordered group of data and the first external parity signal.

8. The device of claim 7, wherein a delay provided by at least one delay circuit is of sufficient duration to maintain a delay margin between a leading edge of at least a first external parity signal and corresponding leading edges of the data in the delayed version of the first ordered group of data, within a threshold delay margin.

* * * * *